(12) United States Patent
Fork et al.

(10) Patent No.: US 8,704,086 B2
(45) Date of Patent: Apr. 22, 2014

(54) SOLAR CELL WITH STRUCTURED GRIDLINE ENDPOINTS VERTICES

(75) Inventors: David K. Fork, Mountain View, CA (US); Scott E. Solberg, Mountain View, CA (US)

(73) Assignee: Solarworld Innovations GmbH, Freiberg (DE)

( * ) Notice: Subject to any disclaimer, the term of this patent is extended or adjusted under 35 U.S.C. 154(b) by 627 days.

(21) Appl. No.: 12/873,709

(22) Filed: Sep. 1, 2010

(65) Prior Publication Data

US 2010/0319761 A1 Dec. 23, 2010

Related U.S. Application Data

(63) Continuation-in-part of application No. 12/267,223, filed on Nov. 7, 2008, now abandoned.

(51) Int. Cl.
*H01L 31/0224* (2006.01)

(52) U.S. Cl.
USPC .............................................. 136/256; 438/98

(58) Field of Classification Search
USPC .................................. 136/256, 244; 222/129
See application file for complete search history.

(56) References Cited

U.S. PATENT DOCUMENTS

| | | |
|---|---|---|
| 2,031,387 A | 2/1936 | Schwarz |
| 2,789,731 A | 4/1957 | Marraffino |
| 3,032,008 A | 5/1962 | Land et al. |
| 3,159,313 A | 12/1964 | Guilford |
| 3,602,193 A | 8/1971 | Adams et al. |
| 4,018,367 A | 4/1977 | Morine et al. |
| 4,119,058 A | 10/1978 | Schmermund |
| 4,141,231 A | 2/1979 | Kudlich |
| 4,254,894 A | 3/1981 | Fetters |
| 4,420,510 A | 12/1983 | Kunkel et al. |
| 4,461,403 A | 7/1984 | Prahs |
| 4,476,165 A | 10/1984 | McIntyre |
| 4,490,418 A | 12/1984 | Yoshida |
| 4,521,457 A | 6/1985 | Russell et al. |

(Continued)

FOREIGN PATENT DOCUMENTS

| | | |
|---|---|---|
| EP | 06044821 A1 | 7/1994 |
| EP | 1787786 A | 5/2007 |

(Continued)

OTHER PUBLICATIONS

Finlayson et al. "Bi2O3-Wo3 compounds for photocatalytic applications by solid state and viscous processing", Title from a conference scheduled for Oct. 6-7, 2004 in Munich, 8 pages.

(Continued)

*Primary Examiner* — Jayne Mershon

(57) ABSTRACT

An H-pattern solar cell structure includes at least one busbar disposed in a first direction on an upper surface of a semiconductor substrate, and parallel gridlines formed on the semiconductor substrate such that each gridline extends over and contacts each busbar, wherein each gridline includes a central gridline portion and at least one endpoint structure disposed on at least one end thereof, the endpoint structure having a nominal width that is at least 1.5 times the width of the central gridline portion. The gridlines are co-extruded with a sacrificial material such that a base portion of each gridline forms a flattened structure with sacrificial material formed thereon. The endpoint structures are formed such that Each central gridline portion forms a raised vertex portion extending upward from the upper surface of each busbar.

7 Claims, 17 Drawing Sheets

(56) References Cited

U.S. PATENT DOCUMENTS

| | | |
|---|---|---|
| 4,747,517 A | 5/1988 | Hart |
| 4,778,642 A | 10/1988 | Lee et al. |
| 4,844,003 A | 7/1989 | Slautterback et al. |
| 4,938,994 A | 7/1990 | Choinski |
| 5,000,988 A | 3/1991 | Inoue et al. |
| 5,120,484 A | 6/1992 | Cloeren |
| 5,151,377 A | 9/1992 | Hanoka et al. |
| 5,188,789 A | 2/1993 | Nishiura |
| 5,254,388 A | 10/1993 | Melby et al. |
| 5,353,813 A | 10/1994 | Deevi et al. |
| 5,536,313 A | 7/1996 | Watanabe et al. |
| 5,560,518 A | 10/1996 | Catterall et al. |
| 5,590,818 A | 1/1997 | Raba et al. |
| 5,605,720 A | 2/1997 | Allen et al. |
| 5,700,325 A | 12/1997 | Watanabe |
| 5,733,608 A | 3/1998 | Kessel et al. |
| 5,873,495 A | 2/1999 | Saint-Germain |
| 5,918,771 A | 7/1999 | van der Heijden |
| 6,047,862 A | 4/2000 | Davies |
| 6,257,450 B1 | 7/2001 | Jackson et al. |
| 6,293,498 B1 | 9/2001 | Stanko et al. |
| 6,375,311 B1 | 4/2002 | Kuramoto |
| 6,398,370 B1 | 6/2002 | Chiu et al. |
| 6,418,986 B1 | 7/2002 | Gabriele |
| 6,423,140 B1 | 7/2002 | Liu et al. |
| 6,529,220 B1 | 3/2003 | Matsumoto |
| 6,558,146 B1 | 5/2003 | Shah et al. |
| 6,666,165 B2 | 12/2003 | Shiraishi et al. |
| 6,743,478 B1 | 6/2004 | Kiiha et al. |
| 6,890,167 B1 | 5/2005 | Kwok et al. |
| 7,101,592 B2 | 9/2006 | Gueggi et al. |
| 2001/0053420 A1 | 12/2001 | Donges et al. |
| 2003/0015820 A1 | 1/2003 | Yamazaki et al. |
| 2003/0201581 A1 | 10/2003 | Weber et al. |
| 2004/0265407 A1 | 12/2004 | Prugh et al. |
| 2005/0067729 A1 | 3/2005 | Laver et al. |
| 2005/0194037 A1 | 9/2005 | Asai |
| 2005/0221613 A1 | 10/2005 | Ozaki et al. |
| 2006/0141086 A1 | 6/2006 | Haynes et al. |
| 2007/0108229 A1* | 5/2007 | Fork et al. .................... 222/129 |
| 2007/0110836 A1 | 5/2007 | Fork et al. |
| 2008/0138456 A1 | 6/2008 | Fork et al. |
| 2008/0216887 A1* | 9/2008 | Hacke et al. .................. 136/244 |
| 2010/0116310 A1* | 5/2010 | Shimizu et al. ............... 136/244 |

FOREIGN PATENT DOCUMENTS

| | | | |
|---|---|---|---|
| EP | 1898265 A2 | | 3/2008 |
| EP | 1918245 A2 | | 5/2008 |
| EP | 1920849 A2 | | 5/2008 |
| GB | 1206280 A | | 9/1970 |
| JP | 60082680 A | | 5/1985 |
| JP | 05-031786 A | | 2/1993 |
| JP | 2005051216 | | 2/2005 |
| JP | WO 2008/044696 | * | 4/2008 |
| WO | 91/15355 | | 10/1991 |
| WO | 00/50215 | | 8/2000 |
| WO | 03030228 A2 | | 4/2003 |
| WO | 03/076701 A | | 9/2003 |
| WO | 2005/070224 A1 | | 8/2005 |
| WO | 2005/107957 A1 | | 11/2005 |
| WO | 2005/107958 A1 | | 11/2005 |

OTHER PUBLICATIONS

Mueller et al. "Breathable Polymer Films Produced by the Microlayer Coextrusion Process", Journal of Applied Polymer Science, vol. 78, pp. 816-828, 2000.

Schweizer, Peter M. "Curtain Coating Technology Can Mean Big Benefits", Paper, Film & Foil Converter website, Mar. 1, 2000, 5 pages, http://pffc-online.com/mag/paper_curtain_coating_technology/.

Extrusion/Coextrusion Dies, Extrusion Dies Industries, LLC, http://www.extrusiondies.com/PRODUCTS/ExtrusionDies/multimanifoldDies.html, 1 page.

Citsco, Gimac Compact Triplex TR12 Micro-Coextrusion Plant, NPE 2000, Jun. 19-23, 2000, McCormick Place, Chicago, IL, Booth 13154, http://www.citsco.com/NPE2000/npepage1.html, 2 pages.

RAO et al. "Microfabricated Deposition Nozzles for Direct-Write Assembly of Three-Dimensional Periodic Structures", Advanced Materials, vol. 17, No. 3, Feb. 10, 2005, pp. 289-293.

Van Hoy et al. "Microfabrication of Ceramics by Co-extrusion", J. Am. Ceram. Soc., vol. 81, No. 1, pp. 152-158, 1998.

* cited by examiner

SOLAR CELL WITH STRUCTURED GRIDLINE ENDPOINTS VERTICES

RELATED APPLICATIONS

This application is a continuation-in-part of U.S. Patent application for "MICRO-EXTRUSION SYSTEM WITH AIRJET ASSISTED BEAD DEFLECTION", U.S. application Ser. No. 12/267,223, filed Nov. 7, 2008.

FIELD OF THE INVENTION

This invention relates to systems and methods for producing solar cells, and more particularly to micro-extrusion systems and methods for producing H-pattern solar cells.

BACKGROUND OF THE INVENTION

Co-extrusion is useful for many applications, including inter-digitated pn junction lines, conductive gridlines for solar cells, electrodes for electrochemical devices, etc.

In order to meet the demand for low cost large-area semiconductors, micro-extrusion methods have been developed that include extruding a dopant bearing material (dopant ink) along with a sacrificial material (non-doping ink) onto the surface of a semiconductor substrate, and then heating the semiconductor substrate such that the dopant disposed in the dopant ink diffuses into the substrate to form the desired doped region or regions. In comparison to screen printing techniques, the extrusion of dopant material on the substrate provides superior control of the feature resolution of the doped regions, and facilitates deposition without contacting the substrate, thereby avoiding wafer breakage. Such fabrication techniques are disclosed, for example, in U.S. Patent Application No. 20080138456, which is incorporated herein by reference in its entirety.

FIGS. 19(A) and 19(B) are plan views showing a typical metallization pattern formed a conventional H-pattern solar cell 30.

As shown in FIG. 19(A), H-pattern solar cell 30 includes a semiconductor substrate 31 having an upper surface 32, and a series of closely spaced parallel metal fingers ("gridlines") 34 that run substantially perpendicular to one or more bus bars 35, which gather current from gridlines 34. In a photovoltaic module, bus bars 35 become the points to which metal ribbon (not shown) is attached, typically by soldering, with the ribbon being used to electrically connect one cell to another. The desired geometry for bus bars 35 in an H-pattern cell is about 1 to 2 mm in width and about 0.005 to 0.20 mm in height. These very wide and thin dimensions (low aspect ratio) create a challenge for conventional extrusion printing. For reliability reasons, it is desirable to avoid making the extrusion nozzle too narrow (or short) in order to avoid clogging, particularly when one is printing a particle filled material such as the silver loaded ink that is used to metalize solar cells. Furthermore, die-swell, the tendency for the ink bead to expand after it exits the nozzle, causes further thickening of the wet printed line. For cost reasons, it is desirable to print no more silver to form bus bar 35 than is necessary for soldering. For throughput reasons, it is desirable to print the bus bar 35 as rapidly as possible, specifically at speeds in excess of 100 mm/second, which equates to producing tens of megawatts of product per printer per year. Referring to FIG. 19(B), back surface 36 of H-pattern solar cell 30 typically has a metallization structure consisting of solderable silver bus bar lines 39 and a broad area aluminum back surface field coating 36. Typically these two metallizations are deposited in two separate screen printing steps.

FIG. 20 illustrates a problem encountered in the production of conventional H-pattern solar cells 30 using conventional techniques. In particular, FIG. 20 shows a problem commonly arising in the extrusion printing of the front metallization of H-pattern solar cell 30, where weak adherence of each gridline 34 to surface 32 of substrate 31, particularly at endpoints 34A of each gridline 34, results in poor conduction and possible loss (detachment) of gridline 34.

FIG. 21 illustrates another problem commonly arising in the extrusion printing of the front metallization of conventional H-pattern solar cell 30 using screen printing techniques. As indicated in FIG. 21, in most conventional H-pattern solar cells, the frontside gridline pattern includes gridlines 34 and busbars 35 that are substantially co-planar. In the case of screen printed solar cells, this co-planarity is the result of the simultaneous printing of both busbars 35 and gridlines 34 through a single screen. In the case of dispensed gridlines in the prior art (for example U.S. Pat. No. 5,151,377 by Hanoka), low viscosity inks are employed with cause the bus bar and gridline vertex to reflow and substantially planarize. The coplanar structure is thought to be important in order to obtain a robust solder joint between the bus bar and the string ribbons that are attached to the bus bar. However, with these conventional methods, breaks in the busbars have been observed at the busbars/gridline intersection, making cell testing and sorting inaccurate because of an anomalously large series resistance.

What is needed is a system and method for producing H-pattern solar cells at a low cost that addresses the problems associated with conventional extrusion and screen printing manufacturing techniques described above, and is acceptable to the solar cell industry.

SUMMARY OF THE INVENTION

The present invention is directed to H-pattern solar cells that are produced at a low cost using a method that addresses the problems associated with conventional manufacturing techniques by manipulating the gridline production process to directly print at least one endpoint structure at the end of each gridline, and by extruding these gridlines immediately after forming the busbars. Although current flow is minimal at the ends of the gridlines (thus making relatively wide endpoint structures counter-intuitive based on electrical considerations), the provision of gridlines with at least one wide endpoint structure provides a significant benefit over conventional structures by providing H-pattern solar cells that exhibit a significant improvement in withstanding gridline fracture and delamination. By forming these gridlines immediately after forming the busbars (e.g., while the busbar material is still wet), reliable connection between the gridlines and the busbars is substantially improved over conventional techniques.

In accordance with an embodiment of the invention, H-pattern solar cells are produced using a micro-extrusion system that is controlled to manipulate the printhead speed and/or gridline material extrusion pressure at the beginning, middle and end of each gridline printing process such that teardrop-shaped ("dot") endpoint structures are formed at the ends of each gridline, whereby each endpoint structure has a substantially greater width than that of the main "central" gridline structure extending between the endpoint structures.

In accordance with one specific embodiment, printhead pressure is manipulated to generate the desired gridline characteristics by increasing the pressure of the extrusion material supplied to an extrusion printhead assembly at the beginning of the gridline printing process. This high pressure forces gridline material from the extrusion printhead assembly at a substantially high rate such that the extruded material pools (collects) to form first endpoint structures having the desired teardrop shape. The pressure of the extrusion material supplied to an extrusion printhead assembly is then reduced while the printhead assembly is moved over the substrate, whereby extrusion material exits the printhead assembly at a reduced rate to form relatively narrow "central" gridline structures extending from each first endpoint structure. Before reaching the opposite side of the substrate, the pressure is again increased such that gridline material is again forced from the extrusion printhead assembly at a substantially high rate and the extruded material pools (collects) to form second endpoint structures having the desired teardrop shape.

In accordance with another specific embodiment, printhead speed is manipulated to generate the desired gridline characteristics by decreasing the printhead speed at the beginning of the gridline printing process to cause gridline material to pool and form the first endpoint structure having the desired teardrop shape, then increasing the speed while moving the printhead over the substrate to form a relatively narrow "central" gridline structure, and then again decreasing the printhead speed to form the second endpoint structure. This approach facilitates maintaining a uniform pressure and flow rate of extrusion material through the extrusion printhead assembly.

In accordance with yet another specific embodiment, the H-pattern solar cells are produced using a micro-extrusion system that is modified to produce high aspect-ratio gridlines by co-extruding gridline material and a sacrificial material such that the sides of each high aspect-ratio gridline are supported by sacrificial material structures. In this embodiment, the desired endpoint structures are generated by manipulating the relative pressures used to force the gridline and sacrificial materials through the micro-extrusion printhead. In particular, the extrusion pressure applied to the gridline material is increased and the extrusion pressure applied to the sacrificial material is decreased at the beginning of the gridline printing process such that most or substantially all of the extruded material comprises gridline material, thereby forming the first endpoint structure having a relatively flat/wide base and a relatively narrow upper ridge, with sacrificial material disposed on each side of the ridge. Next, the extrusion pressure applied to the gridline material is decreased and/or the extrusion pressure applied to the sacrificial material is increased to produce the desired co-extruded gridline structure (i.e., high aspect-ratio gridline sandwiched between sacrificial material portions). Finally, when the printhead approaches the second end of the substrate, the extrusion pressure applied to the gridline material is again increased and/or the extrusion pressure applied to the sacrificial material is decreased to form the second endpoint structure having features similar to the first endpoint.

In accordance with yet another aspect of the present invention, a micro-extrusion system further includes a busbar printing apparatus positioned to print busbars onto the substrate immediately before the micro-extrusion printhead is utilized to form the high aspect ratio gridlines described above. The resulting structure includes gridlines having a "vertex" (high point) disposed on top of the busbar structures. By forming the gridlines onto the "still wet" busbars, superior soldering connections of the gridlines to the busbars was achieved, and production yields were improved over conventional methods.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

The present invention relates to an improvement in microextrusion systems. The following description is presented to enable one of ordinary skill in the art to make and use the invention as provided in the context of a particular application and its requirements. As used herein, directional terms such as "upper", "top", "lower", "bottom", "front", "rear", and "lateral" are intended to provide relative positions for purposes of description, and are not intended to designate an absolute frame of reference. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
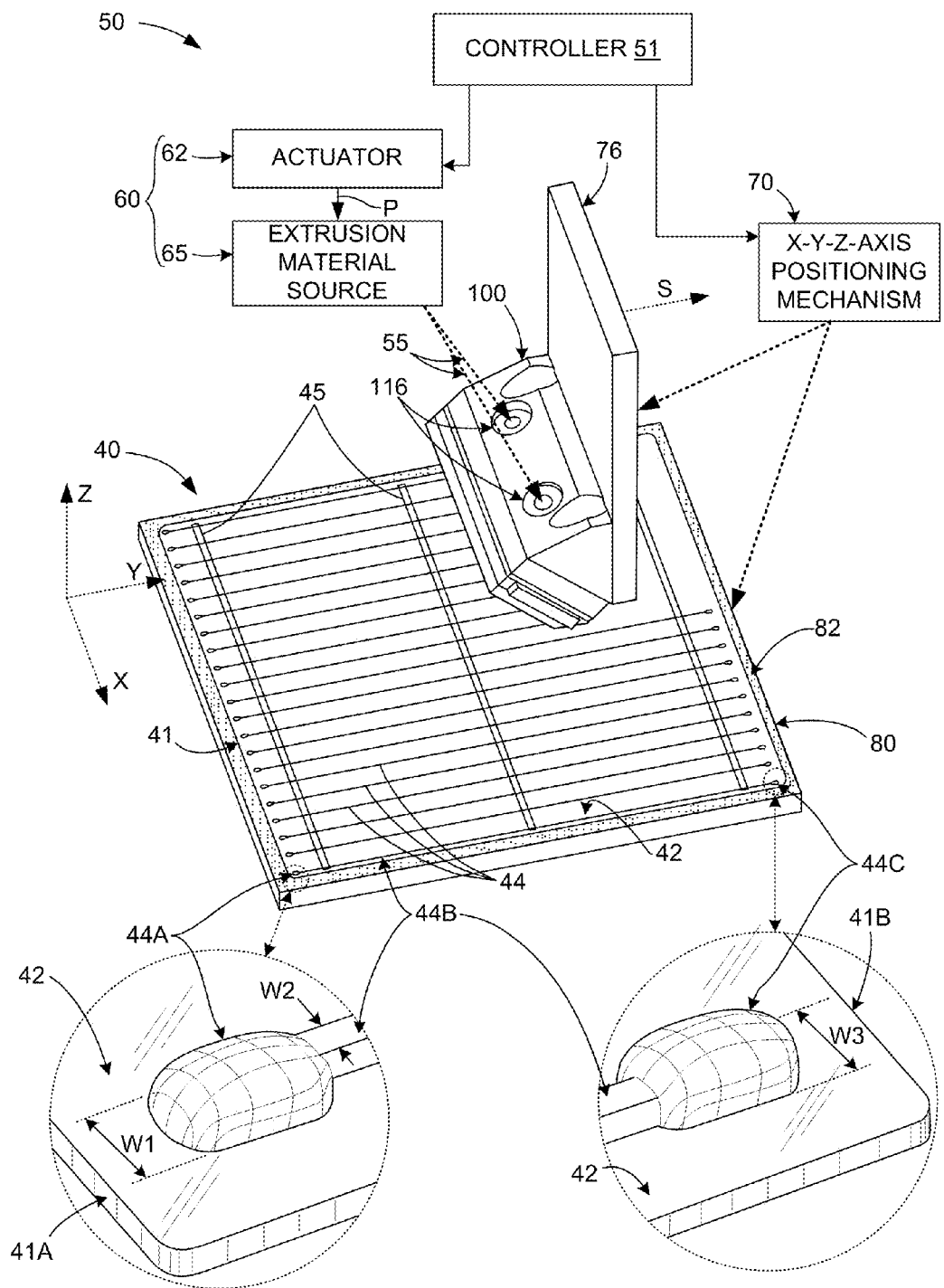
FIG. 1 is a partial perspective view showing a portion of a micro-extrusion system including a micro-extrusion printhead assembly for producing gridlines having endpoint structures according to an embodiment of the present invention.

FIG. 1 is a simplified diagram illustrating a portion of a system 50 and an H-pattern solar cell 40 that is produced using system 50 according to the methods described below. Similar to conventional H-pattern solar cells, H-pattern solar cell 40 includes a semiconductor substrate 41 having an upper surface 42, and a series of closely spaced parallel metal fingers ("gridlines") 44 that run substantially perpendicular to one or more bus bars 45. Referring to the lower portion of FIG. 1, according to an aspect of the present invention, H-pattern solar cell 40 differs from conventional cells in that each gridline 44 includes a relatively wide first endpoint structure 44A, a relatively narrow central section 44B, and a relatively wide second endpoint structure 44C. That is, endpoint structures 44A and 44C are disposed at opposite ends of the central section 44B and located adjacent to opposing sides 41A and 41B, respectively, of substrate 41. As indicated in the dashed line bubbles in FIG. 1, endpoint structures 44A and 44C are formed from the same material as central section 44B using the methods described below to have nominal widths W1 and W3, respectively, that are substantially wider (e.g., 1.5 times or more) as a width W2 of central section 44B. The present inventors content that it is counter-intuitive to form gridlines 44 with endpoint structures 44A and 44C using the methods described below because very little current flows near the ends of gridlines 44. That is, a solar cell grid design based solely on electrical considerations would, if the metallization technology so-permitted, have a progressive narrowing from busbar 45 to substrate edges 41A and 41B. This tapered gridline arrangement follows directly from consideration of the fact that the amount of electrical current carried by the gridline increases linearly with distance along the gridline from substrate edges 41A and 41B to busbar 45. As such, based on electrical considerations, forming gridlines that have wide endpoint structures 44A and 44C using the methods described herein would be counter-intuitive.

Figure 19A:
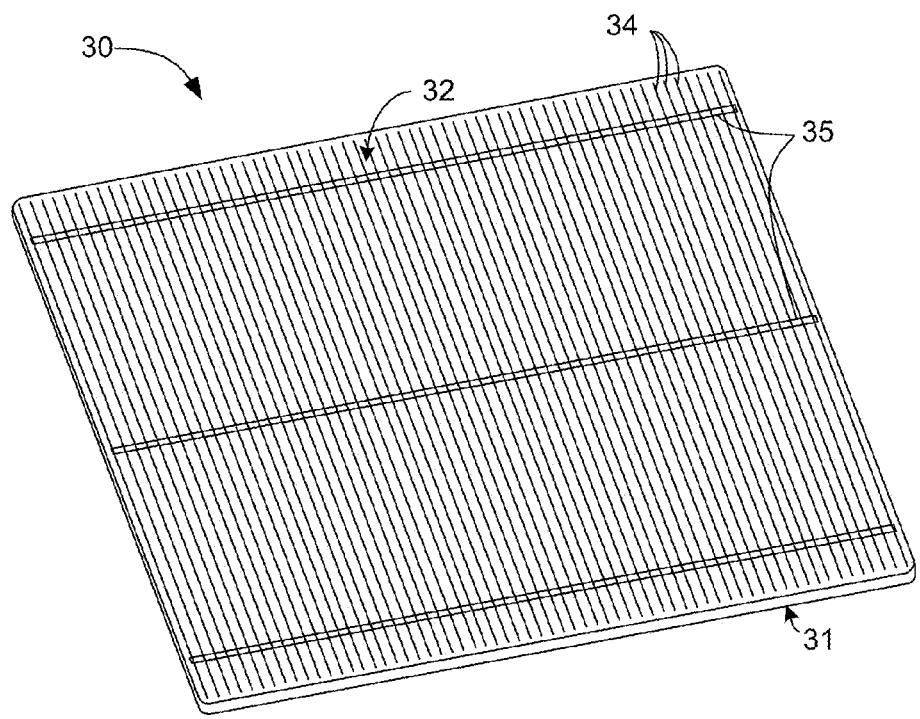
FIGS. 19(A) and 19(B) are top and bottom perspective views, respectively, showing a conventional H-pattern solar cell.
Figure 19B:
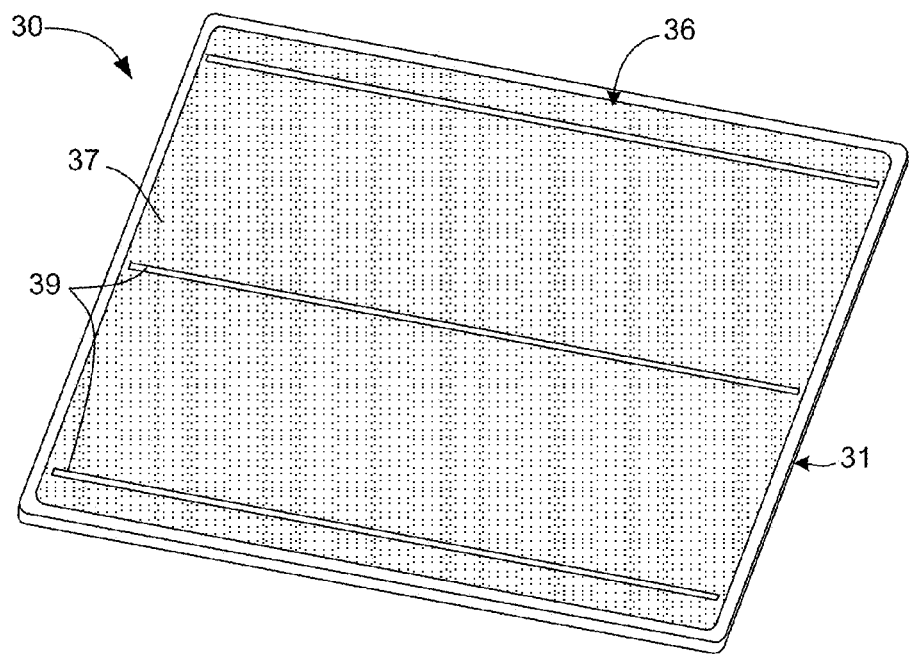
Figure 20:
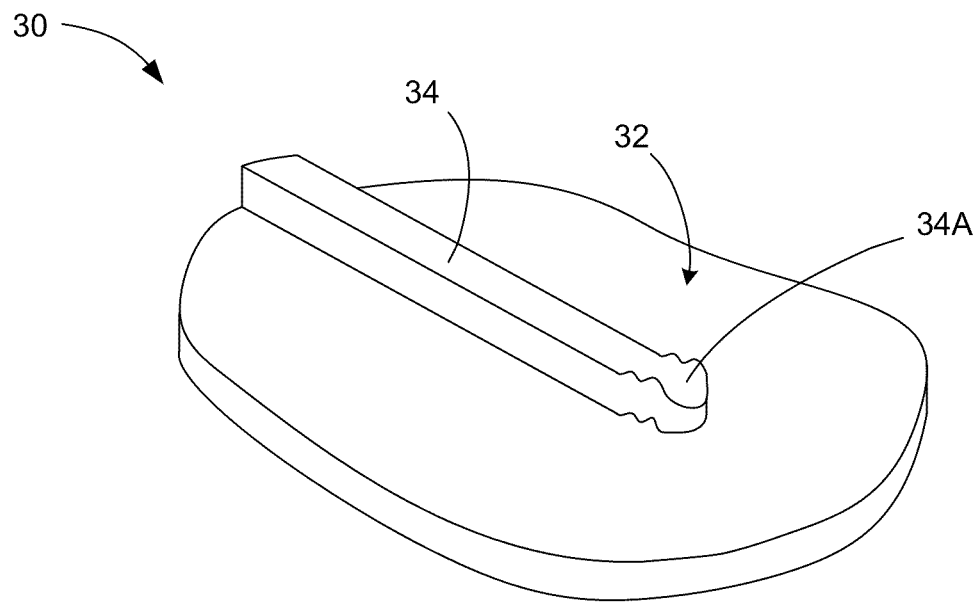
FIG. 20 is an enlarged partial perspective view showing a gridline endpoint of a gridline of a conventional H-pattern solar cell that is printed using conventional extrusion techniques.
Figure 21:
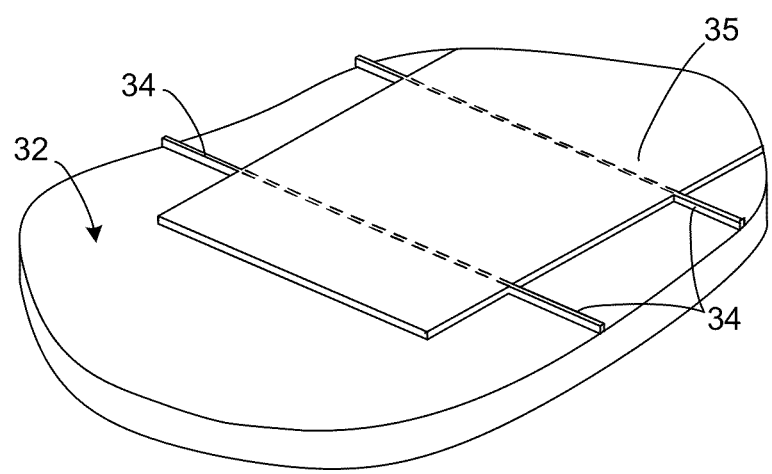
FIG. 21 is an enlarged partial perspective view showing gridline-to-busbar structures of an H-pattern solar cell produced using conventional screen printing techniques.

Referring again to FIG. 1, system 50 is utilized to produce H-pattern solar cell 40 utilizing the methods described below, and generally includes a controller 51 that controls a material feed mechanism 60 and an X-Y-Z-axis positioning mechanism 70 to selectively force gridline material 55 from a printhead assembly 100 onto upper surface 42 of substrate 41 as described below in order to form gridlines 44. In particular, controller 51 (e.g., a microprocessor and associated software) is programmed according to known techniques to generate and transmit control signals to material feed mechanism 60 and X-Y-Z-axis positioning mechanism 70 in accordance with the production methods described below with reference to FIGS. 2, 11 and 19. The terms "selective" and "selectively", when used in conjunction with extrusion material forced from dispensing orifices of extrusion printhead assembly 100, is intended to mean that extrusion of the material from printhead assembly 100 is controllable (i.e., able to be turned on or off) by way of the control signals transmitted from controller 51 to material feed mechanism 60.

Referring to the upper left portion of FIG. 1, material feed mechanism 60 generally serves to supply gridline material through pushing and/or drawing techniques (e.g., hot and cold) in which the gridline materials are pushed (e.g., squeezed, etc.) and/or drawn (e.g., via a vacuum, etc.) into extrusion printhead assembly 100 through one or more inlet ports 116, and out through outlet orifices (nozzle openings) that are respectively defined in a lower portion of printhead assembly 100. In the present embodiment, material feed mechanism 60 includes an actuator 62 that is operably disposed to supply a pressure P to an extrusion (gridline) material source 65, whereby extrusion material 55 is forced from material source 65 through inlet ports 116 into printhead assembly 100.

Referring to the upper right portion of FIG. 1, X-Y-Z-axis positioning mechanism 70 generally includes a mounting plate 76 for rigidly supporting and positioning a printhead assembly 100 relative to substrate 41, a base 80 including a platform 82 for supporting substrate 41, and one or more motors, associated positioning structures (not shown) and control circuitry that facilitate relative movement of printhead assembly 100 relative to substrate 41 in response to control signals received from controller 51. In one specific embodiment, base 80 maintains platform 82 in a stationary position as printhead assembly 100 is moved in a predetermined (e.g., Y-axis) direction over substrate 41 during the gridline printing process described below in response to control signals received from controller 51. In an alternative embodiment, printhead assembly 100 is stationary or movable only in the Z-axis direction, and base 80 includes an X-Y axis positioning mechanism for moving substrate 41 under printhead assembly 100 in response to control signals received from controller 51. Suitable X-Y-Z positioning mechanisms are well known to those skilled in the art.

In the course of experimentation with the printing of high aspect ratio gridlines utilizing equipment similar to system 50, the present inventors discovered that the mechanical strength of the gridline-substrate interface was approaching extreme limits of withstanding fracture and delamination. Tensile stress in the gridline material is a practically unavoidable consequence of both densification as well as differential thermal contraction during the solar cell metallization firing process. It is difficult to know a priori without experimentation the thickness and process conditions at which the stress limits of the gridlines will be reached. This limit was found by experimentation, and was also found to be coincident with a thickness regime useful for high efficiency cell fabrication. The bending stiffness of the gridline is roughly the cube of the height of a line for a given width, making it less flexible and increasing the external stress induced by thermal contraction during firing. The quantity of internal stress in the gridline reaches an observable limit when the gridline delaminates from the substrate by breaking away portions of the substrate (cohesive failure in the silicon). This cohesive failure is a failure mode that the inventors observed in the high aspect ratio sintered gridlines printed by co-extrusion (discussed below). Failure was commonly observed to originate at the endpoints of the gridlines. This is a consequence of crack initiation.

Figure 2:
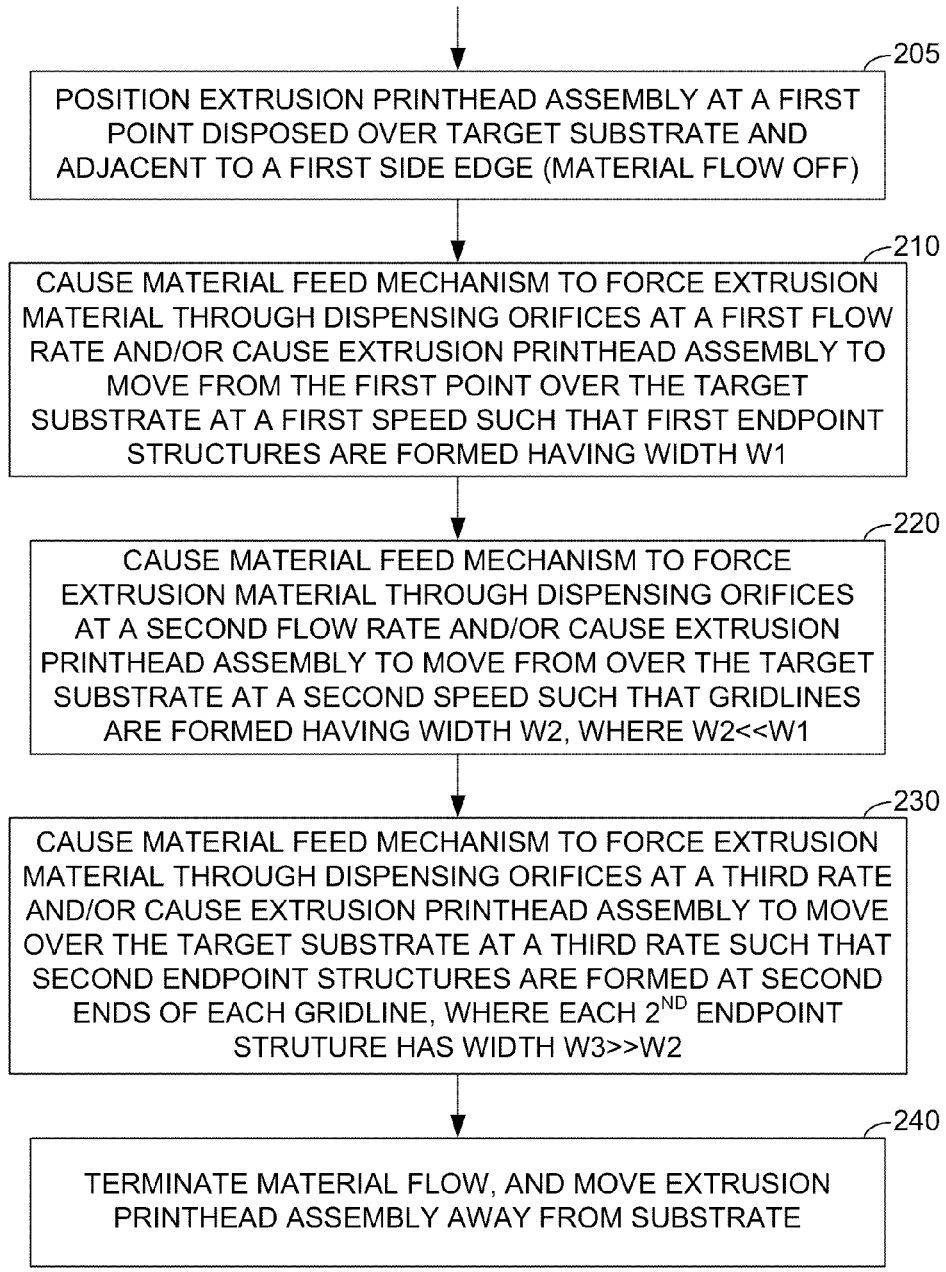
FIG. 2 is a simplified flow diagram indicating processes performed by the micro-extrusion system of FIG. 1 to produce gridlines having endpoint structures according to another embodiment of the present invention.

FIG. 2 is a flow diagram showing a modified extrusion process (method) according to the present invention that provides a solution to the above-described endpoint crack nucleation problem by controlling at least one of material feed mechanism 60 and X-Y-Z-axis positioning mechanism 70 such that endpoint structures 44A and 44C are formed at the start and end of each gridline 44, wherein endpoint structures 44A and 44C provide a larger area of adhered gridline material on substrate surface 42, and as a result reduce the likelihood of initiating delamination at the endpoints of each gridline.

Referring to the upper portion of FIG. 2 and FIG. 1, an optional initial phase (block 205) involves transmitting operable control signals from controller 51 to positioning mechanism 70 such that printhead assembly 100 is positioned at a first point over substrate 41 and adjacent to side edge 41. During the initial phase, operable control signals are also sent from controller 51 to material feed mechanism 60 such that material flow through printhead assembly 100 is turned off (e.g., zero pressure P is applied by actuator 62 to supply 65, whereby no material is extruded onto substrate 41).

During the next phase (first time period, block 210 of FIG. 2), operable control signals are transmitted from controller 51 to material feed mechanism 60 such that material flow through printhead assembly 100 is initiated at a first rate (e.g., a first pressure P1 is applied by actuator 62 to supply 65, whereby material is extruded onto substrate 41A). At the same time, operable control signals are transmitted from controller 51 to positioning mechanism 70 such that printhead assembly 100 is moved at a first rate S1 over substrate 41 away from side edge 41A. Pressure P1 and speed S1 are coordinated in the manner described in additional detail below such that the resulting material flow through printhead assembly 100 forms first endpoint structures 44A having width W1 on upper surface 42.

After first endpoint structures 44A are formed, operable control signals are transmitted from controller 51 to material feed mechanism 60 and positioning mechanism 70 during a next phase (second time period) such that material flow through printhead assembly 100 is adjusted to a second pressure P2 and printhead assembly 100 is moved at a second rate S2 over substrate 41 away from endpoint structures 44A such that the resulting material flow through printhead assembly 100 forms central gridline portions 44B having width W2 on upper surface 42 (FIG. 2, block 220). In particular, either the printhead speed is increased from that used to produce the first endpoint structure, the extrusion material pressure is decreased from that used to produce the first endpoint structure, or both the printhead speed is increased and the extrusion material pressure is decreased in order to generate central gridline portions 44B having width W2. The control signals to material feed mechanism 60 and positioning mechanism 70 are continued (maintained) until printhead assembly 100 approaches second side edge 41B of target substrate 41, whereby central gridline portions 44B extend over most of the width of substrate 41 between side edges 41A and 41B.

During the next phase (third time period, block 230 of FIG. 2), operable control signals are transmitted from controller 51 to material feed mechanism 60 such that material flow through printhead assembly 100 is at a third rate (e.g., a third pressure P3 is applied by actuator 62 to supply 65), and at the same time operable control signals are transmitted from controller 51 to positioning mechanism 70 such that printhead assembly 100 is moved at a third rate S3 over substrate 41 toward side edge 41B. Pressure P3 and speed S3 are coordinated in the manner described in additional detail below such that the resulting material flow through printhead assembly 100 forms second endpoint structures 44C having a third width W3 on upper surface 42, where each second endpoint structure 44C is contiguous with an associated central gridline portion 44B. In one embodiment, pressure P3 and speed S3 are substantially identical to pressure P1 and speed S1 utilized during the production of first endpoint structures 44A, and width W3 of second endpoint structures 44C is substantially equal to width W1 of first endpoint structures 44A.

Referring to the lower portion of FIG. 2 and FIG. 1, an optional final phase (block 240) involves transmitting operable control signals from controller 51 to material feed mechanism 60 while printhead assembly 100 is located over substrate 41 adjacent to side edge 41B such that material flow through printhead assembly 100 is turned off (e.g., zero pressure P is applied by actuator 62 to supply 65, whereby material flow is terminated), and then transmitting operable control signals to positioning mechanism 70 such that printhead assembly 100 is moved away from substrate 41. By terminating material flow through printhead assembly 100 before the extruded gridline structure extends to side edge 41B, the possibility of gridline material forming unwanted short circuit structures extending between the opposing upper and lower surfaces on side edge 41B is prevented.

Figure 3:
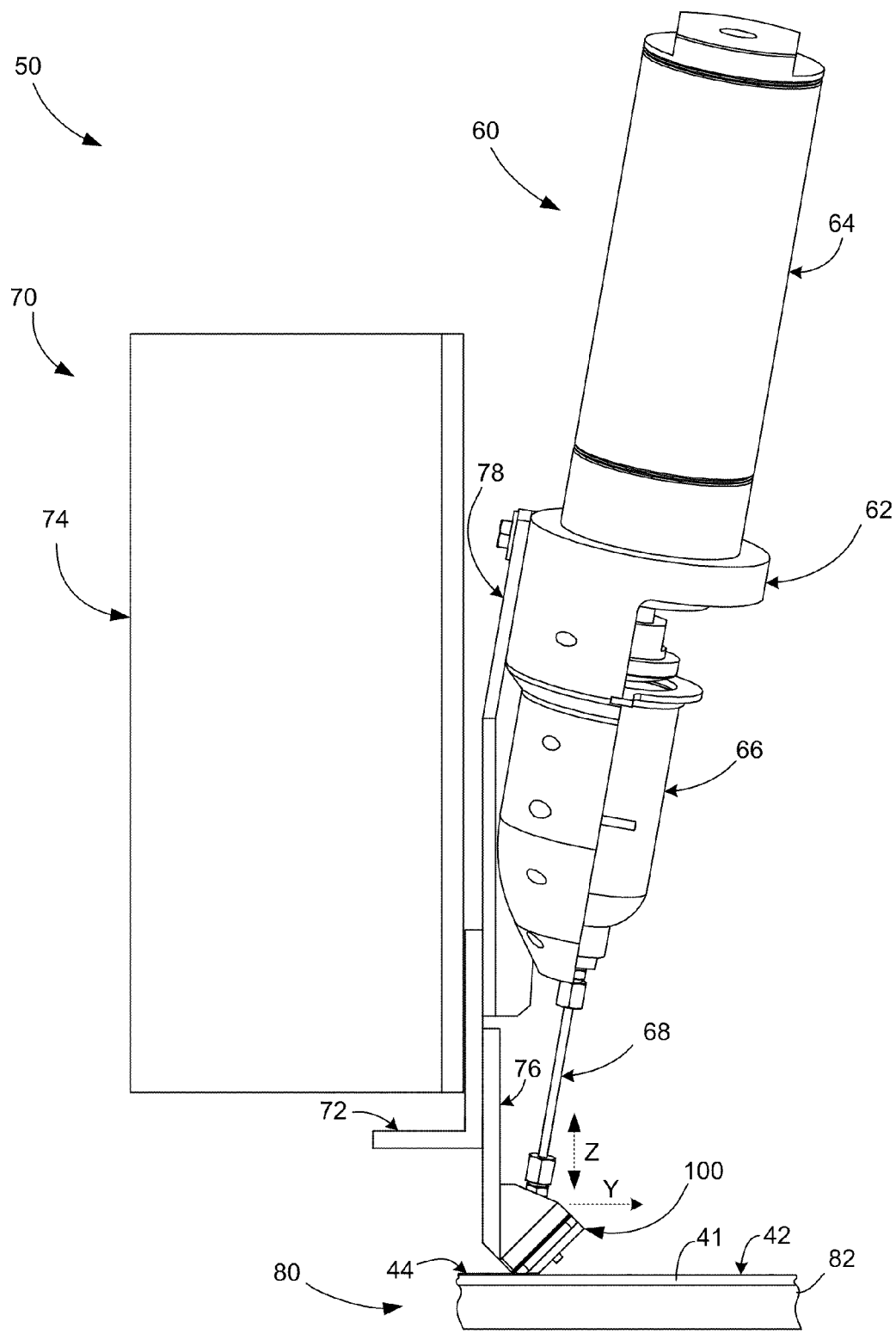
FIG. 3 is a side view showing a portion of the micro-extrusion system of FIG. 1 in additional detail.

FIG. 3 shows material feed mechanism 60, X-Y-Z-axis positioning mechanism 70 and base 80 of micro-extrusion system 50 in additional detail. The assembly shown in FIG. 3 represents an experimental arrangement utilized to produce solar cells on a small scale, and those skilled in the art will recognize that other arrangements would typically be used to produce solar cells on a larger scale utilizing the methods described herein. Referring to the upper right portion of FIG. 3, material feed mechanism 60 includes a housing 62 that supports a pneumatic cylinder 64, which is operably coupled to a cartridge 66 and controlled by controller 51 (described above with reference to FIG. 1) such that material is forced from cartridge 66 through feedpipe 68 into printhead assembly 100. Referring to the left side of FIG. 3, X-Y-Z-axis positioning mechanism 70 includes a Z-axis stage 72 that is movable in the Z-axis (vertical) direction relative to target substrate 51 by way of a housing/actuator 74 using known techniques. Mounting plate 76 is rigidly connected to a lower end of Z-axis stage 72 and supports printhead assembly 100, and a mounting frame 78 is rigidly connected to and extends upward from Z-axis stage 72 and supports pneumatic cylinder 64 and cartridge 66. Referring to the lower portion of FIG. 3, base 80 includes supporting platform 82, which in one embodiment supports target substrate 51 in a stationary position, and an X-Y mechanism (not shown) for moving printhead assembly 100 in the X-axis and Y-axis directions (as well as a couple of rotational axes) over the upper surface of substrate 51 utilizing known techniques.

Figure 4:
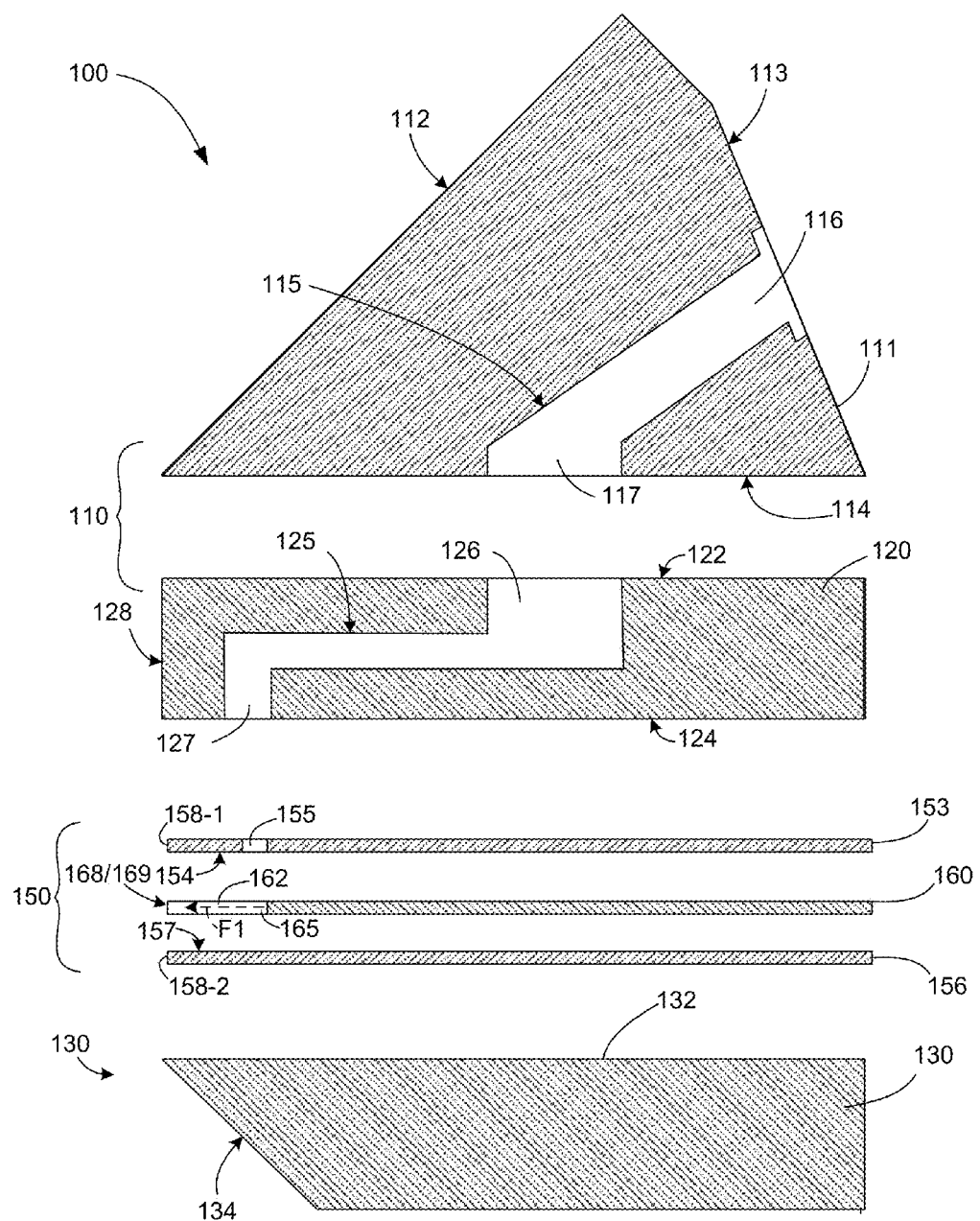
FIG. 4 is an exploded cross-sectional exploded side view showing generalized micro-extrusion printhead assembly utilized in the system of FIG. 1.
Figure 5:
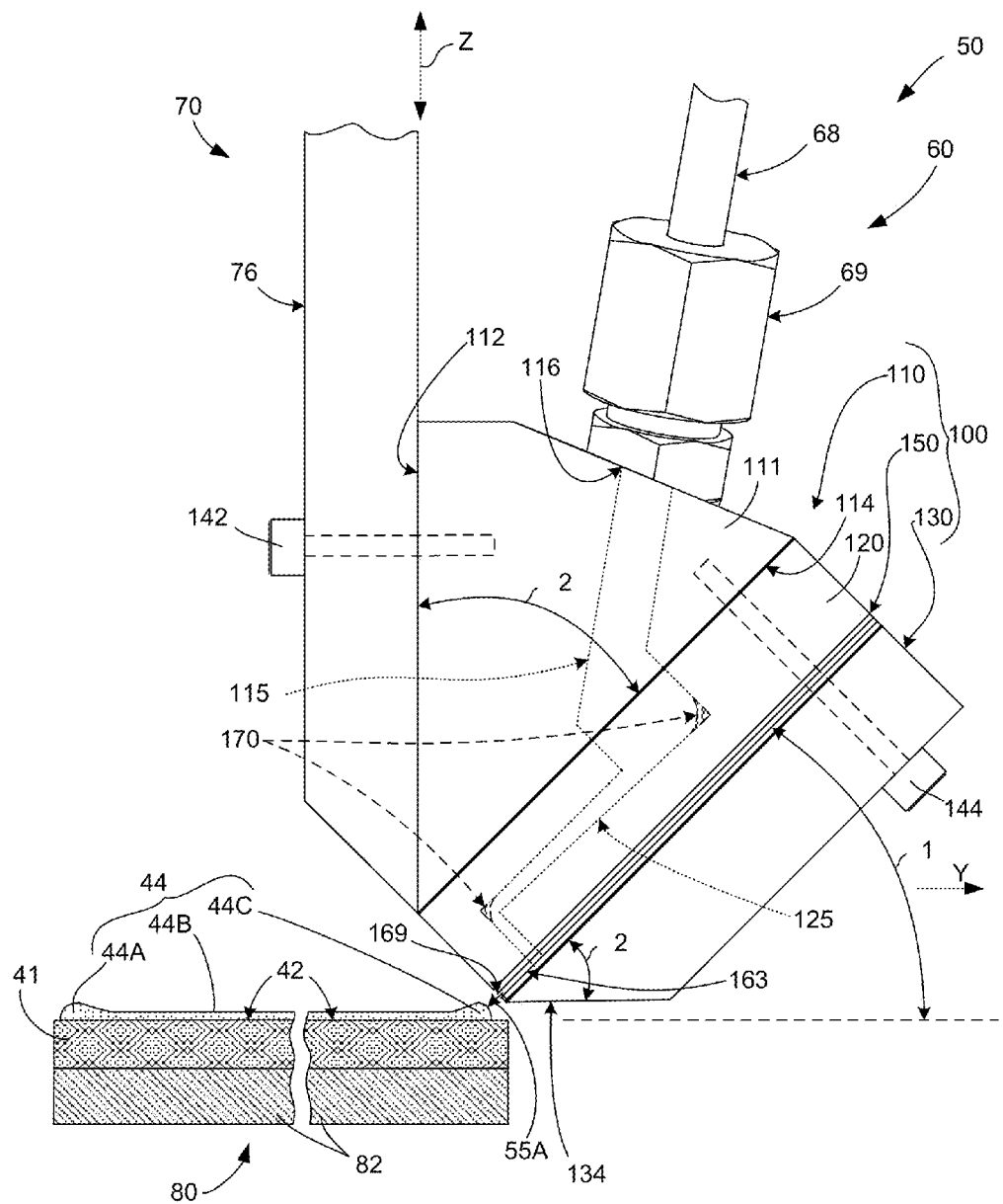
FIG. 5 is a side view showing a portion of the micro-extrusion system of FIG. 1 including the micro-extrusion printhead assembly of FIG. 4 during operation.

FIG. 4 shows layered micro-extrusion printhead assembly 100 in an exploded cross-sectional view, and FIG. 5 shows micro-extrusion printhead assembly 100 during operation. Referring to FIG. 4, layered micro-extrusion printhead assembly 100 includes a first (back) plate structure 110, a second (front) plate structure 130, and a layered nozzle structure 150 connected therebetween. Back plate structure 110 and front plate structure 130 serve to guide the extrusion material from an inlet port 116 to layered nozzle structure 150, and to rigidly support layered nozzle structure 150 such that extrusion nozzles 163 defined in layered nozzle structure 150 are pointed toward substrate 41 at a predetermined tilted angle θ1 (e.g., 45°) during operation, as shown in FIG. 5, whereby extruded material traveling down each extrusion nozzle 163 toward its corresponding nozzle orifice 169 is directed toward target substrate 51.

Each of back plate structure 110 and front plate structure 130 includes one or more integrally molded or machined metal parts. In the disclosed embodiment, back plate structure 110 includes an angled back plate 111 and a back plenum 120, and front plate structure 130 includes a single-piece metal plate. Angled back plate 111 includes a front surface 112, a side surface 113, and a back surface 114, with front surface 112 and back surface 114 forming a predetermined angle θ2 (e.g., 45°; shown in FIG. 5). Angled back plate 111 also defines a bore (upper flow channel portion) 115 that extends from a threaded countersunk bore inlet 116 defined in side wall 113 to a bore outlet 117 defined in back surface 114. Back plenum 120 includes parallel front surface 122 and back surface 124, and defines a conduit (lower flow channel portion) 125 having an inlet 126 defined through front surface 122, and an outlet 127 defined in back surface 124. As described below, bore 115 and plenum 125 cooperate to form a flow channel that feeds extrusion material to layered nozzle structure 150. Front plate structure 130 includes a front surface 132 and a beveled lower surface 134 that form predetermined angle θ2 (shown in FIG. 5).

Figure 6A:
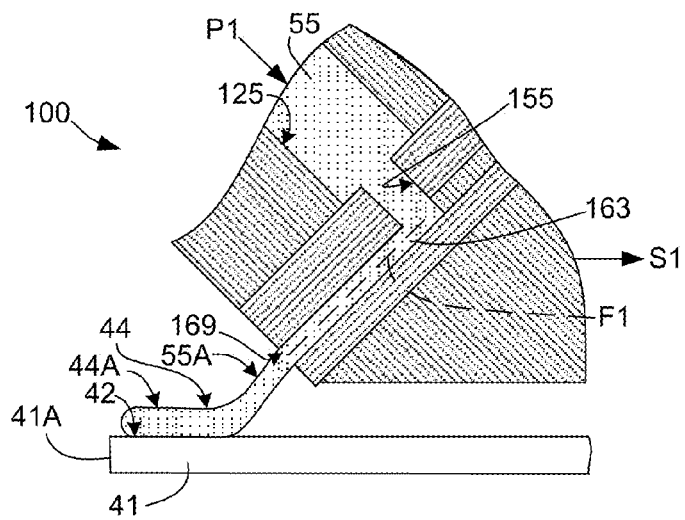
FIGS. 6(A), 6(B) and 6(C) are cross-sections side views showing the micro-extrusion printhead assembly of FIG. 4 during formation of a gridline having endpoint structures according to an exemplary embodiment of the present invention.

Layered nozzle structure 150 includes two or more stacked plates (e.g., a metal such as aluminum, steel or plastic that combine to form one or more extrusion nozzles 163. In the embodiment shown in FIG. 4, layered nozzle structure 150 includes a top nozzle plate 153, a bottom nozzle plate 156, and a nozzle outlet plate 160 sandwiched between top nozzle plate 153 and bottom nozzle plate 156. Top nozzle plate 153 defines an inlet port (through hole) 155, and has a (first) front edge 158-1. Bottom nozzle plate 156 is a substantially solid (i.e., continuous) plate having a (third) front edge 158-2. Nozzle outlet plate 160 includes a (second) front edge 168 and defines an elongated nozzle channel 162 extending in a predetermined first flow direction F1 from a closed end 165 to an nozzle orifice 169 defined through front edge 168. When operably assembled (e.g., as shown in FIG. 6(A)), nozzle outlet plate 160 is sandwiched between top nozzle plate 153 and bottom nozzle plate 156 such that elongated nozzle channel 162, a front portion 154 of top nozzle plate 153, and a front portion 157 of bottom nozzle plate 156 combine to define elongated extrusion nozzle 163 that extends from closed end 165 to nozzle orifice 169. In addition, top nozzle plate 153 is mounted on nozzle outlet plate 160 such that inlet port 155 is aligned with closed end 165 of elongated channel 162, whereby extrusion material 55 forced through inlet port 155 flows in direction F1 along extrusion nozzle 163, and exits from layered nozzle structure 150 by way of nozzle orifice 169 as a bead 55A that forms gridline 44 on surface 42 of substrate 41 such that each gridline 44 includes endpoint structures 44A and 44C and central gridline portion 44B, as indicated in FIG. 5.

As shown in FIG. 5, when operably assembled and mounted onto micro-extrusion system 50, angled back plate 111 of printhead assembly 100 is rigidly connected to mounting plate 76 by way of one or more fasteners (e.g., machine screws) 142 such that beveled surface 134 of front plate structure 130 is positioned close to parallel to upper surface 52 of target substrate 51. One or more second fasteners 144 are utilized to connect front plate structure 130 to back plate structure 110 with layered nozzle structure 150 pressed between the back surface of front plate structure 130 and the back surface of back plenum 120. In addition, material feed mechanism 60 is operably coupled to bore 115 by way of feedpipe 68 and fastener 69 using known techniques, and extrusion material forced into bore 115 is channeled to layered nozzle structure 150 by way of conduit 125. In one embodiment, each flow channel (e.g., each bore 115 and its corresponding conduit 125) is fed extrusion material by an associated valve (not shown) that meters the flow of extrusion material into a distribution plenum that serves as a reservoir for feeding extrusion material to the dispensing orifices.

In a preferred embodiment, as shown in FIG. 5, a hardenable material is injected into bore 115 and conduit 125 of printhead assembly 100 in the manner described in co-owned and co-pending U.S. patent application Ser. No. 12/267,147 entitled "DEAD VOLUME REMOVAL FROM AN EXTRUSION PRINTHEAD", which is incorporated herein by reference in its entirety. This hardenable material forms portions 170 that fill any dead zones of conduit 125 that could otherwise trap the extrusion material and lead to clogs.

Figure 6B:
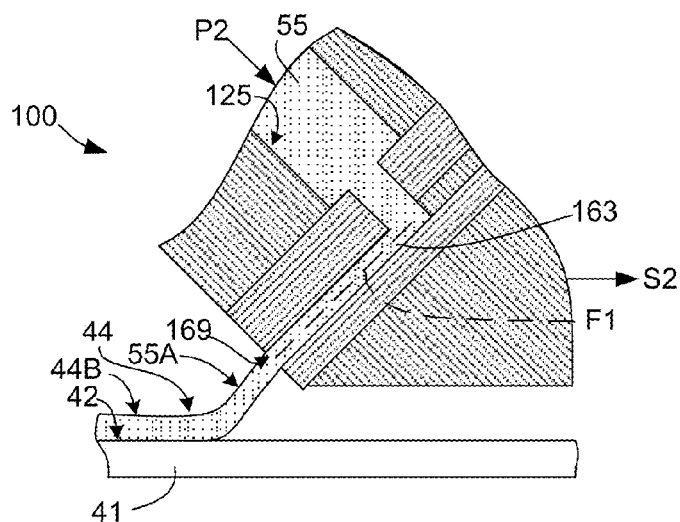
Figure 6C:
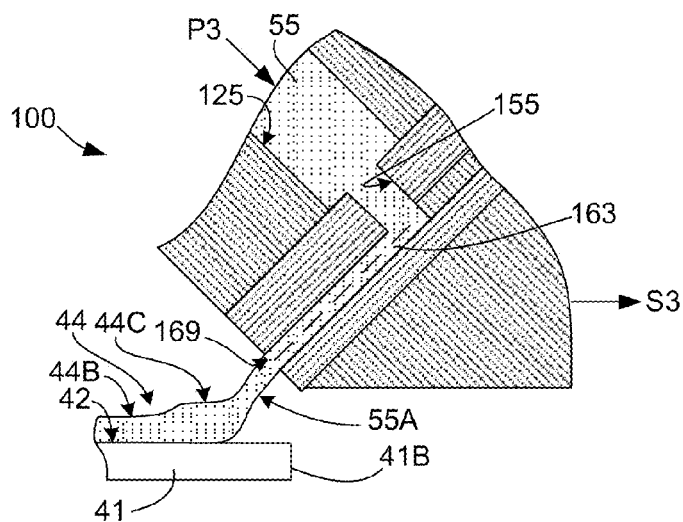

FIGS. 6(A), 6(B) and 6(C) are simplified cross-sectional side view showing a portion of a printhead assembly 100 during operation. As shown in FIG. 6(A), during the formation of first endpoint structures according to block 210 of FIG. 2, while moving printhead assembly 100 at speed S1 relative to substrate 41, extrusion material 55 is forced through conduit 125 under positive pressure P1 into the closed end of nozzle 163 by way of inlet 155, and flows in direction F1 down nozzle 163 and through outlet 169, thereby forming a "flying" bead 55A that is immediately deposited on upper surface 42 of substrate 41 to form first endpoint structure 44A. As shown in FIG. 6(B), during the subsequent formation of central gridline portions 44B of each gridline 44 according to block 220 of FIG. 2, while moving printhead assembly 100 at speed S2 relative to substrate 41, extrusion material 55 is forced by positive pressure P2 through conduit 125 into the closed end of nozzle 163 by way of inlet 155, and flows in direction F1 down nozzle 163 and through outlet 169 such that "flying" bead 55A is deposited on upper surface 42 to form central gridline portions 44B. Finally, as shown in FIG. 6(C), during the subsequent formation of second endpoint structures 44C of each gridline 44 according to block 230 of FIG. 2, while moving printhead assembly 100 at speed S3 relative to substrate 41, extrusion material 55 is forced by positive pressure P3 through conduit 125 and inlet 155 into the closed end of nozzle 163, and flows in direction F1 down nozzle 163 and through outlet 169 such that "flying" bead 55A is deposited on upper surface 42 to form central gridline portions 44B.

Referring to FIGS. 6(A) to 6(C), in accordance with a specific embodiment of the present invention, printhead pressures P1, P2 and P3 are altered to generate the desired gridline characteristics by making pressures P1 and P3 greater than pressure P2, where speeds S1, S2 and S3 are the same. The relatively high pressure P1 of gridline material 55 during the first time period (see FIG. 6(A)) forces gridline material 55A from dispensing orifices 169 at a relatively high rate such that bead 55A pools (collects) to form first endpoint structure 44A having the desired teardrop shape. The pressure of extrusion material 55 supplied to extrusion printhead assembly 100 is then reduced to pressure P2 (see FIG. 6(B)) while printhead assembly 100 is moved over substrate 41, whereby extrusion material exits printhead assembly 110 at a reduced rate to form relatively narrow "central" gridline portions 44B. During the third time period, before reaching opposing side edge 41B of substrate, the pressure of extrusion material 55 supplied to extrusion printhead assembly 100 is increased to pressure P3 such that gridline material is again forced from extrusion printhead assembly 100 at a relatively high rate, and the extruded material pools (collects) to form second endpoint structure 44C having the desired teardrop shape. In one specific embodiment, pressures P1 and P3 are substantially the same, whereby the shape of first and second endpoint structures 44A and 44C are similar (e.g., nominal widths W1 and W2, shown in FIG. 1, are substantially equal).

In accordance with another specific embodiment, pressures P1, P2 and P3 are maintained substantially constant during all three time periods, and the relative speeds S1, S2 and S3 are altered to generate the desired gridline characteristics by making relative speeds S1 and S3 slower than relative speed S2. Referring again to FIG. 6(A), relatively slow speed S1 of printhead assembly 100 during the first time period causes gridline material 55A extruded from dispensing orifices 169 to pool and form first endpoint structure 44A having the desired teardrop shape. The speed of extrusion printhead assembly 100 is then increased to speed S2 (see FIG. 6(B)) while extrusion material exits printhead assembly 110 at substantially the same rate as during the first time period, thereby forming relatively narrow "central" gridline portions 44B. During the third time period, before reaching opposing side edge 41B of substrate, the speed of extrusion printhead assembly 100 is again decreased to speed S3 such that gridline material again pools to form second endpoint structure 44C. In one specific embodiment, speeds S1 and S3 are substantially the same such that the shape of first and second endpoint structures 44A and 44C are similar.

Although the above specific embodiments involve changing one of speed and pressure, those skilled in the art will recognize that both speed and pressure may be altered in ways that produce the gridline structures having the characteristics described herein. Therefore, the appended claims are not limited to either of these specific embodiments unless otherwise specified.

FIGS. 7-11 illustrate a system 50E according to another embodiment of the present invention. System 50E includes an X-Y-Z axis positioning mechanism (partially shown) that are constructed and function in a manner similar to that described above with reference to FIGS. 1 and 3. As set forth in the following paragraphs, system 50E differs from the above-described embodiments in that it includes a material feed mechanism 60E that supplies two extrusion materials to a co-extrusion printhead assembly 100E in response to control signals from a controller (not shown), and printhead assembly 100E is constructed to co-extrude the two extrusion materials in a manner that generates parallel high-aspect ratio gridline structures (described below, e.g., with reference to FIG. 14(B)).

Figure 7:
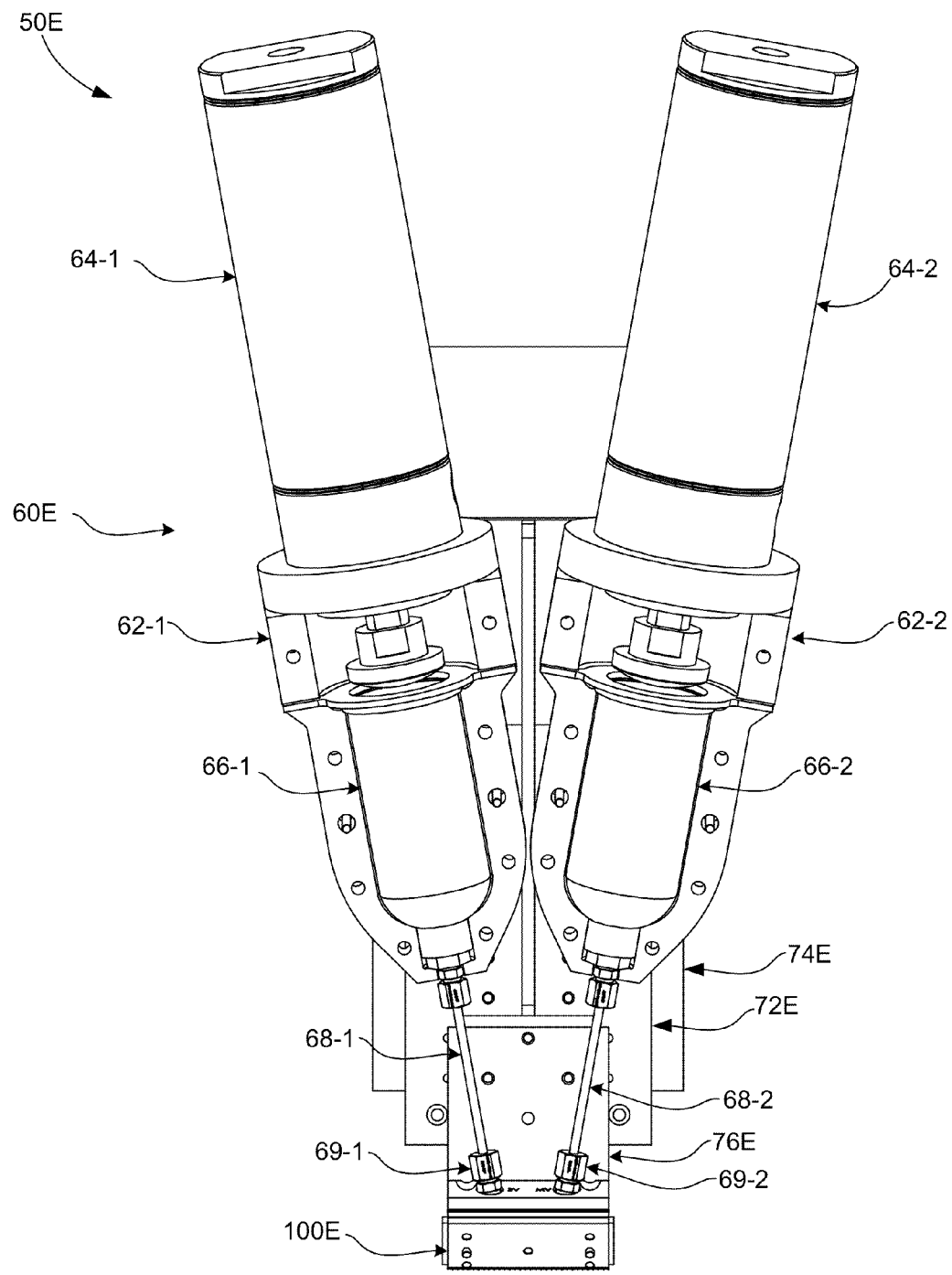
FIG. 7 is a front view showing a micro-extrusion system including a generalized co-extrusion printhead assembly utilized in accordance with another embodiment of the present invention.

Referring to the upper portion of FIG. 7, material feed mechanism 60E includes a pair of housings 62-1 and 62-2 that respectively support pneumatic cylinders 64-1 and 64-2, which is operably coupled to cartridges 66-1 and 66-2 such that material forced from these cartridges respectively passes through feedpipes 68-1 and 68-2 into printhead assembly 100E. As indicated in the lower portion of FIG. 7, the X-Y-Z axis positioning mechanism (partially shown) includes a Z-axis stage 72E that is movable in the Z-axis (vertical) direction by way of a housing/actuator 74E (partially shown) using known techniques. Mounting plate 76E is rigidly connected to a lower end of Z-axis stage 72E and supports printhead assembly 100E, and a mounting frame (not shown) is rigidly connected to and extends upward from Z-axis stage 72E and supports pneumatic cylinders 64-1 and 64-2 and cartridges 66-1 and 66-2.

Figure 8:
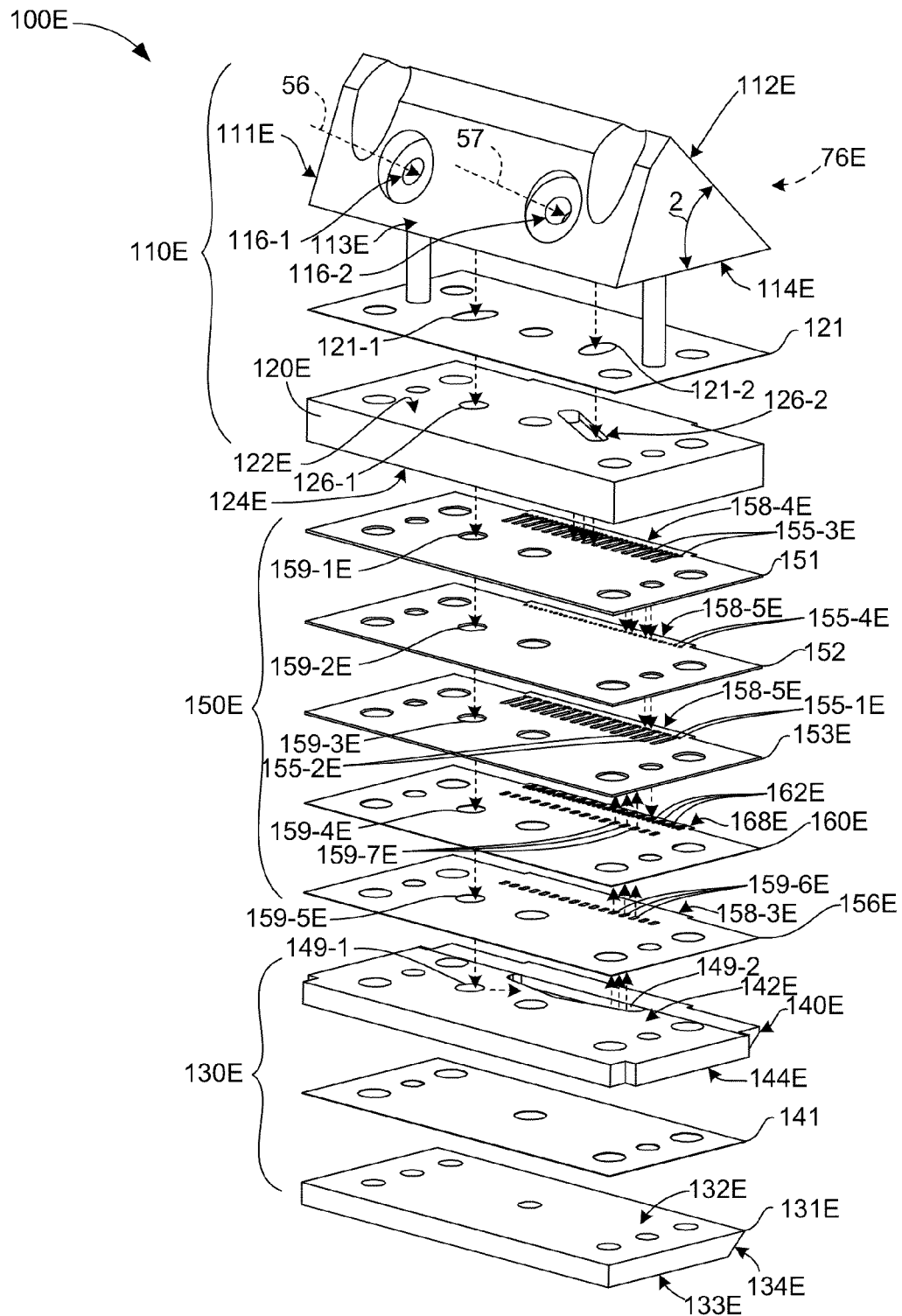
FIG. 8 is an exploded perspective view showing the co-extrusion printhead assembly of FIG. 7 in additional detail.

FIG. 8 is an exploded perspective view showing micro-extrusion printhead 100E in additional detail. Micro-extrusion printhead 100E includes a first (back) plate structure 110E, a second (front) plate structure 130E, and a layered nozzle structure 150E connected therebetween.

Back plate structure 110E and front plate structure 130E serve to guide the extrusion material from corresponding inlet ports 116-1 and 116-2 to layered nozzle structure 150E, and to rigidly support layered nozzle structure 150E such that extrusion nozzles 162E defined in layered nozzle structure 150E are pointed toward substrate 51 at a predetermined tilted angle (e.g., 45°), whereby extruded material traveling down each extrusion nozzle 162E toward its corresponding nozzle orifice 169E is directed toward a target substrate (not shown).

Referring to the upper portion of FIG. 8, back plate structure 110E includes a molded or machined metal (e.g., aluminum) angled back plate 111E, a back plenum 120E, and a back gasket 121 disposed therebetween. Angled back plate 111E includes a front surface 112E, a side surface 113E, and a back surface 114E, with front surface 112E and back surface 114E forming predetermined angle θ2 (e.g., 45°). Angled back plate 111E also defines a pair of bores (not shown) that respectively extend from threaded countersunk bore inlets 116-1 and 116-2 defined in side wall 113E to corresponding bore outlets defined in back surface 114E. Back plenum 120E includes parallel front surface 122E and back surface 124E, and defines a pair of conduits (not shown) extending from corresponding inlets 126-1 and 126-2 defined through front surface 122 to corresponding outlets (not shown) defined in back surface 124E. Similar to the description provided above, the bores/conduits defined through back plate structure 110E feed extrusion material to layered nozzle structure 150E.

Referring to the lower portion of FIG. 8, front plate structure 130E includes a molded or machined metal (e.g., aluminum) front plate 131E, a front plenum 140E, and a front gasket 141 disposed therebetween. Front plate 131E includes a front surface 132E, a side surface 133E, and a beveled back surface 134E, with front surface 132E and back surface 134E forming the predetermined angle described above. Front plate 131E defines several holes for attaching to other sections of printhead assembly 100E, but does not channel extrusion material. Front plenum 140E includes parallel front surface 142E and back surface 144E, and defines a conduit (not shown) extending from corresponding inlet 148 to a corresponding outlet 149, both being defined through front surface 142E. As described below, the conduit defined in front plenum 140E serves to feed one of the extrusion materials to layered nozzle structure 150E.

Similar to the single material embodiment, described above, layered nozzle structure 150E includes a top nozzle plate 153E, a bottom nozzle plate 156E, and a nozzle outlet plate 160E sandwiched between top nozzle plate 153E and bottom nozzle plate 156E. As described in additional detail below, top nozzle plate 153E defines a row of substantially circular inlet ports (through holes) 155-1E and a corresponding series of elongated inlet ports 155-2E that are aligned adjacent to a (first) front edge 158-1E. Bottom nozzle plate 156E is a substantially solid (i.e., continuous) plate having a (third) front edge 158-2E, and defines several through holes 159-6E, whose purpose is described below. Nozzle outlet plate 160E includes a (second) front edge 168E, and defines a row of three-part nozzle channels 162E that are described in additional detail below, and several through holes 159-7E that are aligned with through holes 159-6E. When operably assembled, nozzle outlet plate 160E is sandwiched between top nozzle plate 153E and bottom nozzle plate 156E to form a series of nozzles in which each three-part nozzle channel 162E is enclosed by corresponding portions of top nozzle plate 153E and bottom nozzle plate 156E in the manner described above, with each part of three-part nozzle channel 162E aligned to receive material from two inlet ports 155-1E and one elongated inlet port 155-2E. As described in additional detail below, this arrangement produces parallel high-aspect ratio gridline structures (beads) in which a gridline material is pressed between two sacrificial material sections.

In addition to top nozzle plate 153E, bottom nozzle plate 156E and nozzle outlet plate 160E, layered nozzle structure 150E also includes a first feed layer plate 151 and a second feed layer plate 152 that are stacked over top nozzle plate 153E and served to facilitate the transfer of the two extrusion materials to nozzle outlet plate 160E in the desired manner described below. First feed layer plate 151 is a substantially solid (i.e., continuous) plate having a (fourth) front edge 158-4E, and defines several Y-shaped through holes 155-3E located adjacent to front edge 158-4E, and several feed holes 159-1E whose purposes are described below. Second feed layer plate 152 is disposed immediately below first feel layer plate 151, includes a (fifth) front edge 158-5E, and defines several substantially circular through holes 155-4E located adjacent to front edge 158-5E, and several feed holes 159-2E whose purposes are described below.

Figure 9:
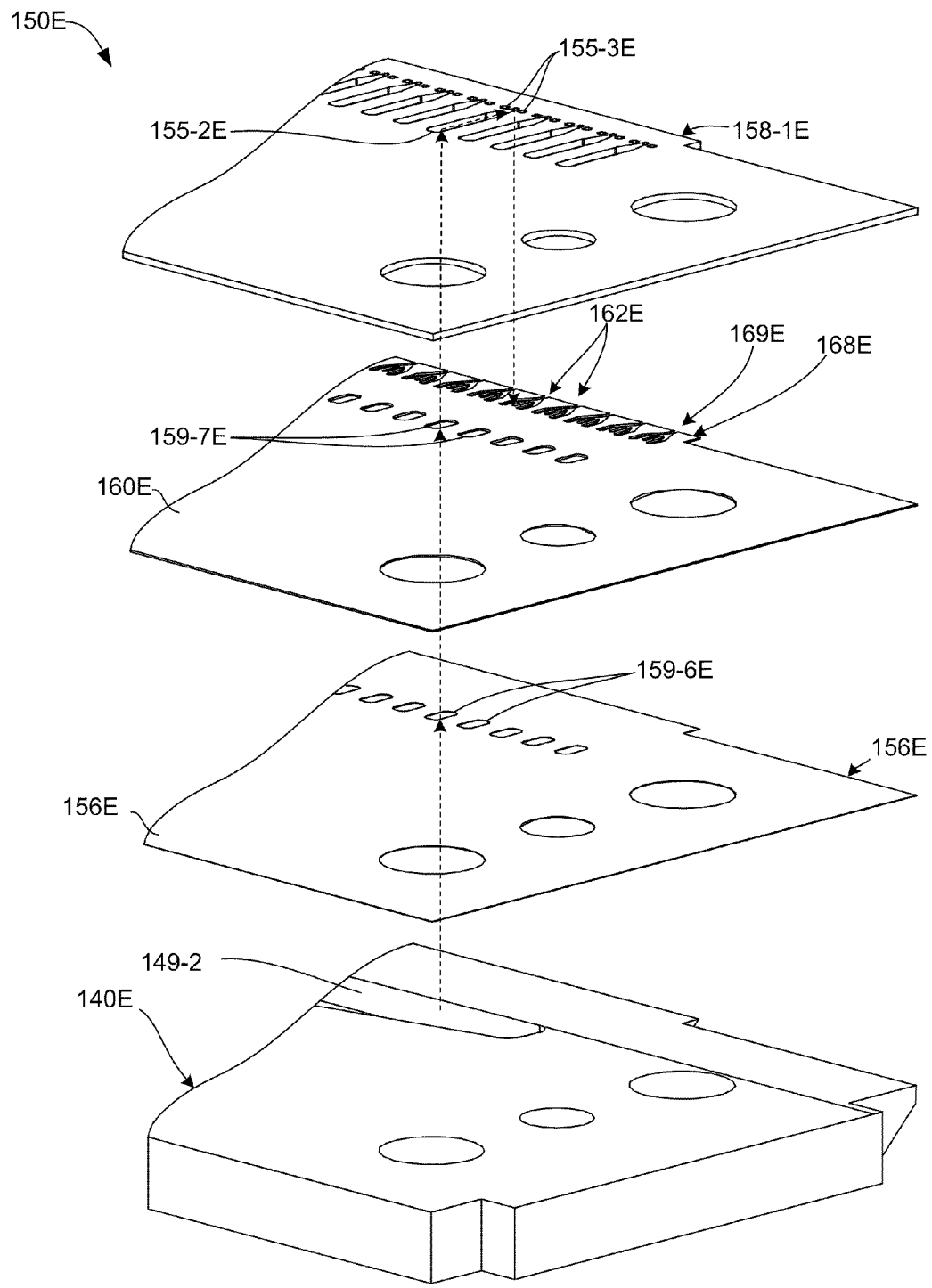
FIG. 9 is an exploded partial perspective view showing a portion of the printhead assembly of FIG. 8 in additional detail.
Figure 10:
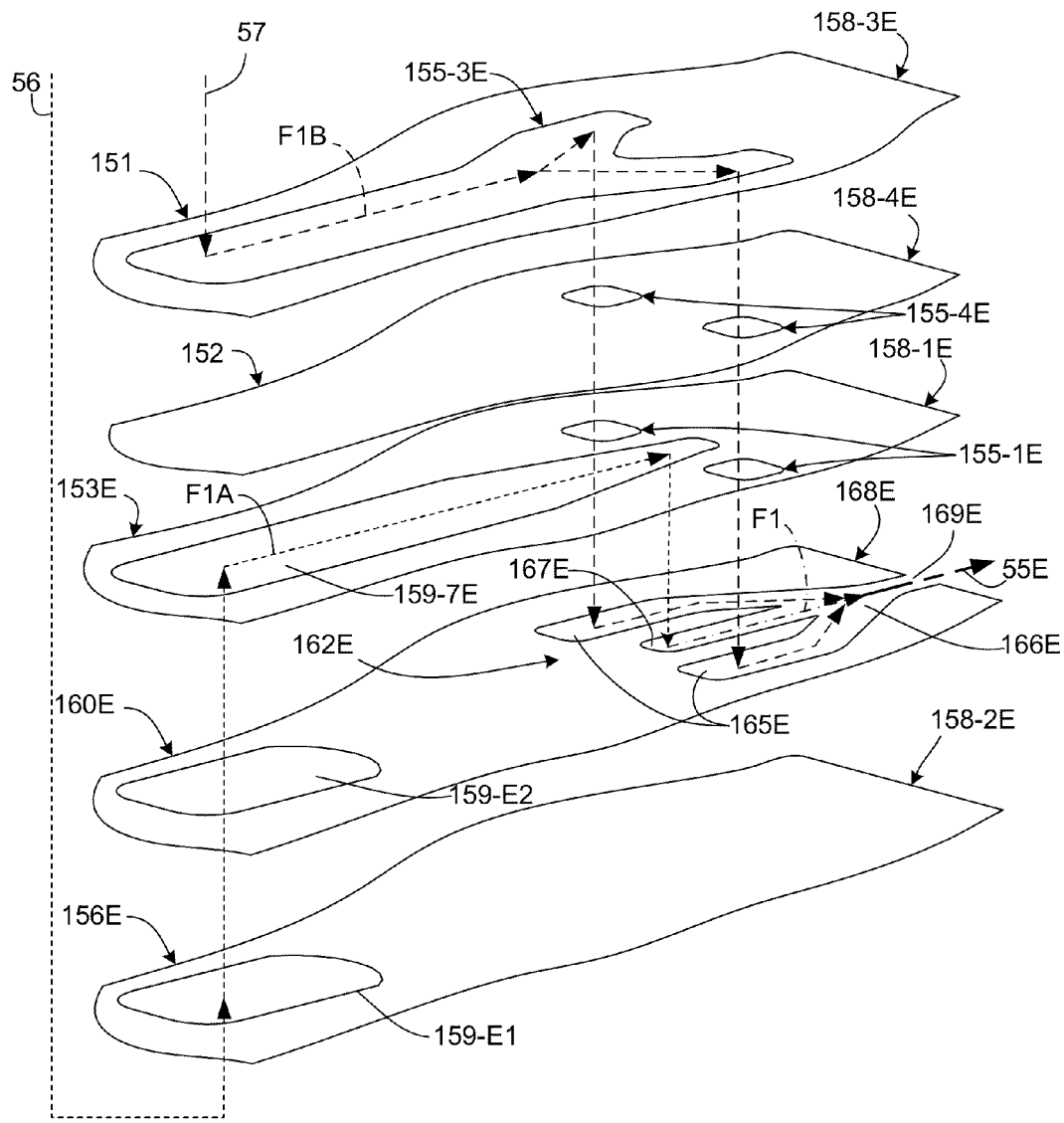
FIG. 10 is a simplified exploded partial perspective view showing a portion of a generalized layered nozzle structure utilized in the co-extrusion printhead assembly of FIG. 7.

As indicated by the dashed arrows in FIG. 8 and described in additional detail in FIGS. 9 and 10, two extrusion materials are fed by way of two separate paths in a substantially Z-axis direction through the various layers of layered nozzle structure 150E to nozzle outlet plate 160E. The two flow paths are described in detail in the following paragraphs.

Referring to the upper portion of FIG. 8, gridline material 55 injected through inlet port 116-1 is fed downward through opening 121-1 in back gasket 121 and into opening 126-1 defined in back plenum 120E. The gridline material then exits back plenum 120E and passes through aligned openings 159-1E to 159-5E respectively formed in first feed layer plate 151, second feed layer plate 152, top nozzle plate 153E, nozzle outlet plate 160E, and bottom nozzle plate 156E before entering opening 149-1 of front plenum 140E. As indicated in FIG. 8 and in additional detail in FIG. 9, the gridline material is then redirected by front plenum 140E and moves upward from opening 149-2 through opening 159-6E formed in bottom nozzle plate 156E and opening 159-7E formed in nozzle outlet plate 160E. As indicated in the upper portion of FIG. 9 and in FIG. 10, the gridline material then enters the rearward end of elongated openings 159-7E, and is redirected in a substantially horizontal direction along arrow F1A to the front end of elongated opening 159-7E. The gridline material is then forced downward into a central channel 167E of three-part nozzle channel 162E, then flows along central channel 167E in the direction of arrow F1 toward dispensing orifice 169E. In the manner described above, each central channel 167E communicates with inlet port 116-1 to pass gridline material 55 to an associated dispensing orifice 169E. As explained in additional detail below, under selected operating conditions, the gridline material flowing along each central channel 167E in the direction of arrow F1 is compressed between corresponding sacrificial material portions in a merge point 166E before exiting from associated dispensing orifice 169E.

Referring again to the upper portion of FIG. 8, sacrificial material 57 injected through inlet port 116-2 is fed downward through opening 121-2 in back gasket 121 and into opening 126-2 defined in back plenum 120E. The sacrificial material is dispersed by plenum 120E and is passed into the rearward end of Y-shaped elongated channels 155-3E, which are formed in first feed layer plate 151. As indicated by dashed arrows in FIGS. 8 and 10, the sacrificial material flows along each Y-shaped elongated channel 155-3E to a split front end region, where the sacrificial material is distributed through corresponding openings 155-4E disposed in second feed layer plate 152 and openings 155-1E disposed in top nozzle plate 153E, and then into opposing side channel 165E of three-part nozzle channel 162E. As described in additional detail below, the sacrificial material then flows along side channels 165E, and presses against the corresponding gridline material before exiting from orifice 169E.

Referring to FIG. 10, nozzle output plate 160E includes a plate that is micro-machined (e.g., using deep reactive ion etching) to include arrowhead-shaped three-part nozzle channel 162E including a central channel 167E and opposing (first and second) side channels 165E. Central channel 167E is separated from each side channel 165E by an associated tapered finger of plate material. Central channel 167E has a closed end that is aligned to receive gridline material from the front end of elongated opening 159-7E of top nozzle plate 153E, and an open end that communicates with a merge point 166E. Similarly, side channels 165E have associated closed ends that are aligned to receive sacrificial material from corresponding openings 155-1E of top nozzle plate 153E, and open ends that communicate with a merge point 166E. Side channels 165E are angled toward central channel 167E such that sacrificial material is fed against opposing sides of the gridline material flowing in central channel 167E.

When gridline material and sacrificial material are simultaneously co-extruded through each nozzle outlet orifice 169E of co-extrusion printhead assembly 100E during the extrusion process, the resulting extruded structure includes a high-aspect ratio gridline structure that is supported by sacrificial material portions respectively disposed on opposing sides of the associated high-aspect ratio gridline structure. As described below with reference to FIG. 14, the shape of extruded structures (i.e., the aspect ratio of the central gridline structure 44B and the shape of the sacrificial portions 57B1 and 57B2) are controllable through at least one of the shapes of the one or more outlet orifices and internal geometry of printhead assembly 100E, characteristics of the materials (e.g., viscosity, etc.), and the extrusion technique (e.g., flow rate, pressure, temperature, etc.). As set forth in the specific embodiment described herein, the structure within the printhead assembly and the shape of the nozzle outlet orifices may be modified to further enhance the extrusion process. Suitable gridline materials include, but are not limited to, silver, copper, nickel, tin, aluminum, steel, alumina, silicates, glasses, carbon black, polymers and waxes, and suitable sacrificial materials include plastic, ceramic, oil, cellulose, latex, polymethylmethacrylate etc., combinations thereof, and/or variations thereof, including combining the above with other substances to obtain a desired density, viscosity, texture, color, etc. To limit the tendency for the materials to intermix after extrusion, extruded beads leaving co-extrusion printhead 100E can be quenched on the target substrate by cooling the substrate using known techniques. Alternately, the gridline (ink) material used may be a hot-melt material, which solidifies at ambient temperatures, in which case co-extrusion printhead 100E is heated, leaving the extruded structures to solidify once they are dispensed onto the target substrate. In another technique, the materials can be cured by thermal, optical and/or other means upon exit from co-extrusion printhead 100E. For example, a curing component can be provided to thermally and/or optically cure the materials. If one or both materials include an ultraviolet curing agent, the material can be bound up into solid form in order to enable further processing without mixing.

Techniques for fabricating the various printheads described above are described, for example, in co-owned and co-pending U.S. patent application Ser. No. 11/555,512, entitled "EXTRUSION HEAD WITH PLANARIZED EDGE SURFACE", which is incorporated herein by reference in its entirety. Alternatively, the laminated metal layer arrangements described herein, the extrusion printheads of the present invention can be manufactured by electroplating metal up through features in a patterned resist structure, by brazing together layers of etched plate metal, by generating structures out of photo-definable polymer such as SU8, or by machining or molding.

Figure 11:
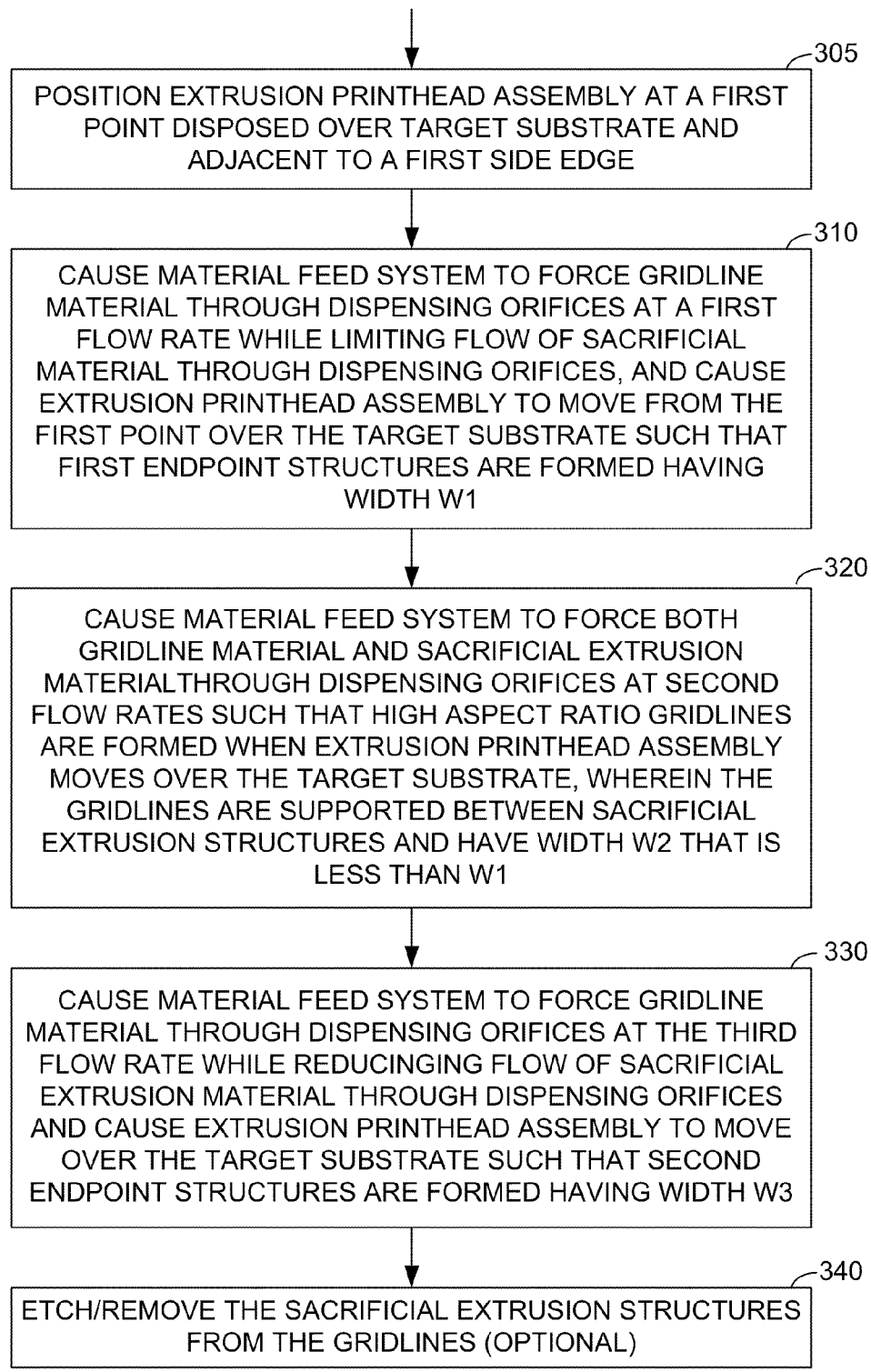
FIG. 11 is a simplified flow diagram indicating processes performed by the micro-extrusion system of FIG. 7 to produce gridlines having endpoint structures according to another embodiment of the present invention.

FIG. 11 is a flow diagram showing an extrusion process (method) according to another embodiment of the present invention that utilizes system 50E (described above).

Figure 12:
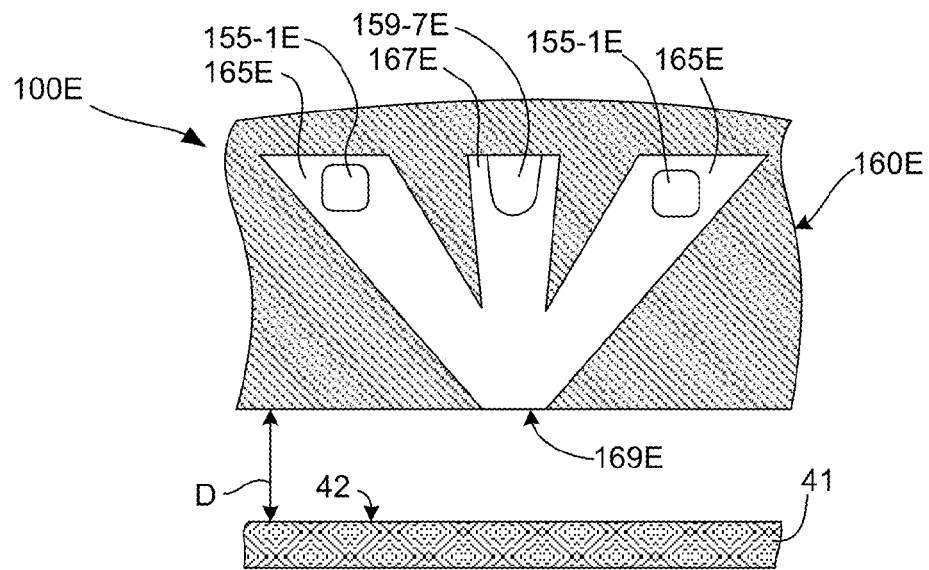
FIG. 12 is a cross-sectional side view showing a simplified three-part fluidic channel defined in the co-extrusion printhead assembly of FIG. 7 during a first phase of the operation illustrated in FIG. 11.

Referring to the upper portion of FIG. 11 and FIG. 12, an optional initial phase (block 305) involves transmitting operable control signals from a controller to a positioning mechanism similar to that described above such that printhead assembly 100E is positioned at a first point over substrate 41. As indicated in FIG. 12, which shows a portion printhead assembly 100E including plate 160E in cross-section disposed a predetermined distance D over surface 42 of substrate 41, during the initial phase, operable control signals are also sent from the controller to the material feed mechanism such that material flow through printhead assembly 100E is turned off. In particular, zero pressure is applied to the gridline and sacrificial material sources such that no material flows through inlet ports 155-1E into side channels 165E, and no material flows through elongated opening 159-7E into central channel 167E. As such, no material flows from dispensing orifice 169E onto surface 42 during the initial phase.

Figure 13:
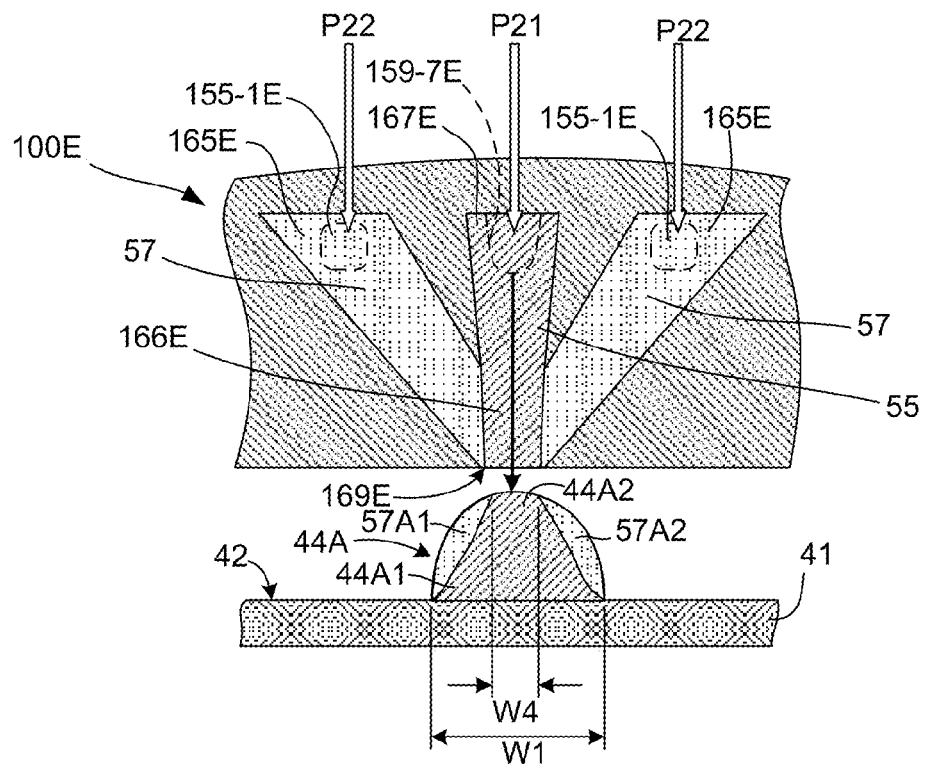
FIG. 13 is a cross-sectional side view showing material flows in the simplified three-part fluidic channel of FIG. 12 and a resulting first endpoint structure produced during a second phase of the operation illustrated in FIG. 11.

Referring to block 310 of FIG. 11 and to FIG. 13, during the next phase, operable control signals are transmitted from the controller to the gridline material feed mechanism such that gridline material flow through printhead assembly 100E is initiated at a first rate, and operable control signals are transmitted from the controller to the sacrificial material feed mechanism such that sacrificial material flows through printhead assembly 100E at a second rate. At the same time, operable control signals are transmitted from the controller to the positioning mechanism such that printhead assembly 100E is moved over substrate 41. The first and second flow rates are selected such that a relatively large volume of gridline material and a relatively small amount of sacrificial material flow through printhead assembly 100E during the first time period such that the resulting material flow through printhead assembly 100E forms first endpoint structures 44A in which the deposited gridline material forms a relatively wide base portion 44A1 having width W1 on upper surface 42, and includes a central ridge portion 44A2 that extends upward from said base portion and is tapered such that an upper edge of said tapered central ridge portion has a relatively narrow width. As indicated in FIG. 13, in accordance with one embodiment, a relatively high pressure P21 is applied to the gridline material source and a relatively low second pressure P22 (i.e., relative to the second time period) is applied to the sacrificial material source such that gridline material flowing through elongated opening 159-7E and into central channel 167E is passed through orifice 169E along with a relatively small amount of sacrificial material entering through inlet ports 155-1E into side channels 165E. The small amount of sacrificial material forced into side channels 165E serves to prevent the backflow of gridline material in printhead assembly 100E which can lead to clogging of orifice 169E. As indicated in FIG. 13, the small amount of sacrificial material co-extruded with the gridline material during the first time period forms thin co-extruded sacrificial portions 57A1 and 57A2 that extend upward from base portion 44A1 and are disposed on opposing sides of central ridge portion 44A2. Sacrificial portions 57A1 and 57A2 typically subsequently slump and spread over the substrate surface around the deposited gridline material after the co-extrusion process, thus covering a wider area than the width of orifice 169E. In a preferred embodiment, pressure P21 is applied to the gridline source a moment before pressure P22 is applied to the sacrificial source.

Figure 14:
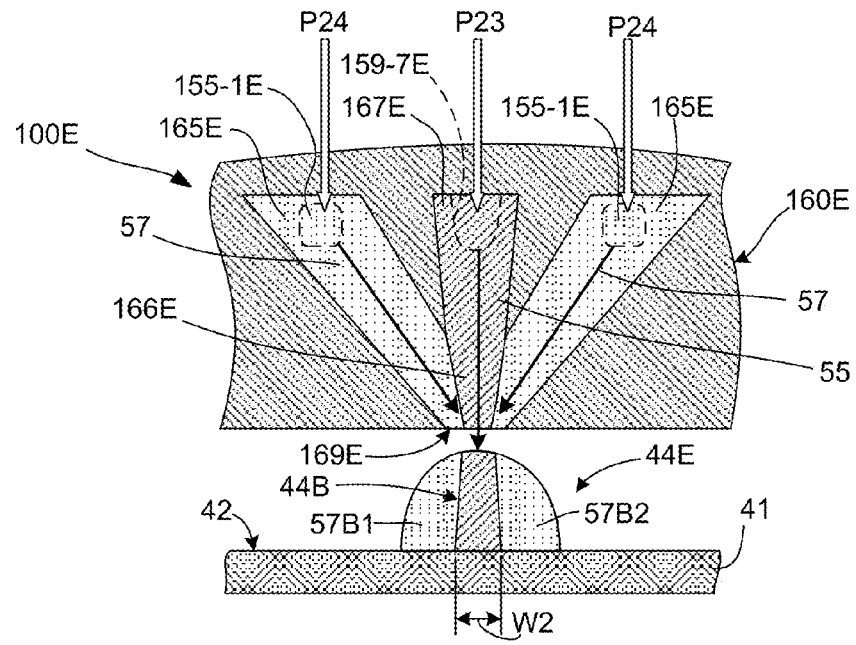
FIG. 14 is a cross-sectional side view showing material flows in the simplified three-part fluidic channel of FIG. 12 and a resulting gridline structure produced during a third phase of the operation illustrated in FIG. 11.

Referring to block 320 of FIG. 11 and to FIG. 14, during the next phase, operable control signals are transmitted from the controller to the gridline and sacrificial material feed mechanisms such that co-extrusion of gridline and sacrificial material flow through printhead assembly 100E is adjusted, and operable control signals are transmitted from the controller to the positioning mechanism such that printhead assembly 100E is moved over substrate 41 such that the resulting material flow through printhead assembly 100E forms central gridline structures 44B having width W1 on upper surface 42, and co-extruded sacrificial portions 57B1 and 57B2 are formed on opposing sides of central gridline structures 44B. As indicated in FIG. 14, during this phase, a pressure P23 is applied to the gridline material source and a pressure P24 is applied to the sacrificial material source such that both gridline material flows through elongated opening 159-7E and into central channel 167E and sacrificial material entering through inlet ports 155-1E into side channels 165E are combined in merge point 166E and passed through orifice 169E to form the desired structure on surface 42 of substrate 41. In one embodiment, gridline pressure P23 during the second time period is higher than pressure P21 used during the first time period, and sacrificial pressure P24 during the second time period is lower than pressure P22 used during the first time period.

Figure 15:
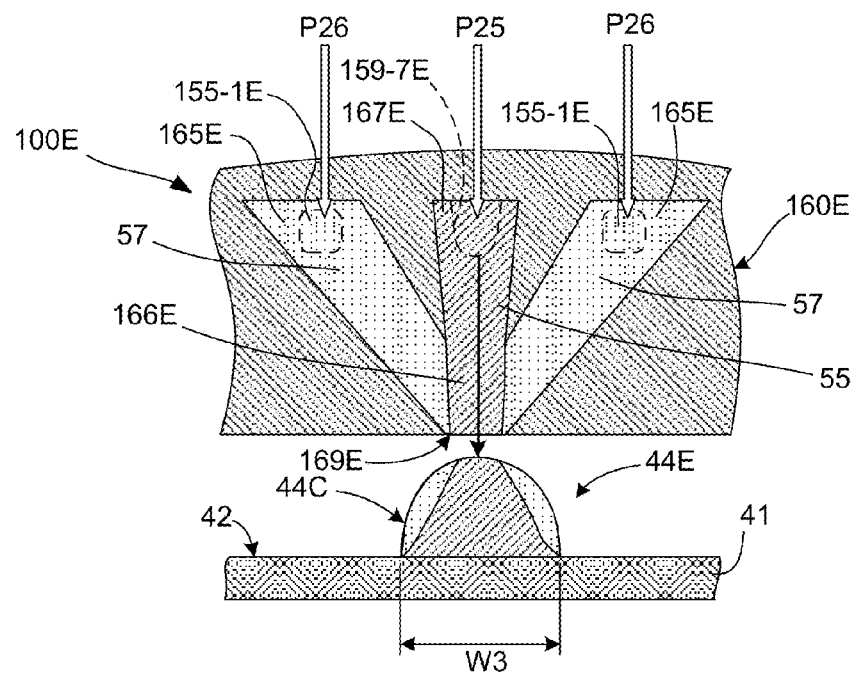
FIG. 15 is a cross-sectional side view showing material flows in the simplified three-part fluidic channel of FIG. 12 and a resulting second endpoint structure produced during a fourth phase of the operation illustrated in FIG. 11.

Referring to block 330 of FIG. 11 and to FIG. 15, when printhead assembly 100E approaches the second side edge of the target substrate, operable control signals are transmitted from the controller to the gridline material feed mechanism such that gridline material flow through printhead assembly 100E is maintained, and operable control signals are transmitted from the controller to the sacrificial material feed mechanism such that sacrificial material flow through printhead assembly 100E is reduced or terminated. At the same time, operable control signals are transmitted from the controller to the positioning mechanism such that printhead assembly 100E is moved over substrate 41 such that the resulting gridline material flow through printhead assembly 100E forms second endpoint structures 44C having width W3 on upper surface 42. As indicated in FIG. 15, during this phase, a relatively high pressure P25 is applied to the gridline material source and a relatively low pressure P26 is applied to the sacrificial material source such that the volume of gridline material flowing through elongated opening 159-7E and into central channel 167E is increased during the third time period, and the volume of sacrificial material entering through inlet ports 155-1E into side channels 165E is decreased in comparison to that of the second time period, whereby more gridline material is forced to enter merge point 166E and flow from orifice 169E. In one embodiment, pressure P26 utilized in the formation of second endpoint structures 44C is substantially identical to pressure P21 utilized during the production of first endpoint structures 44A, and width W3 of second endpoint structures 44C is substantially equal to width W1 of first endpoint structures 44A.

Figure 16A:
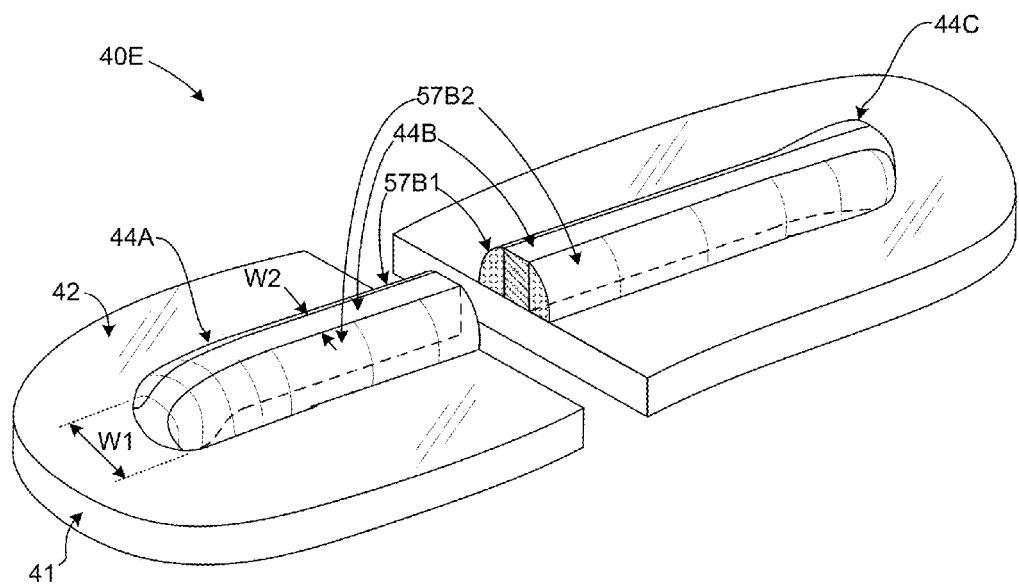
FIGS. 16(A) and 16(B) are partial perspective views showing optional removal of sacrificial material from an exemplary high aspect ratio gridline structure during a fifth phase of the operation illustrated in FIG. 11.
Figure 16B:
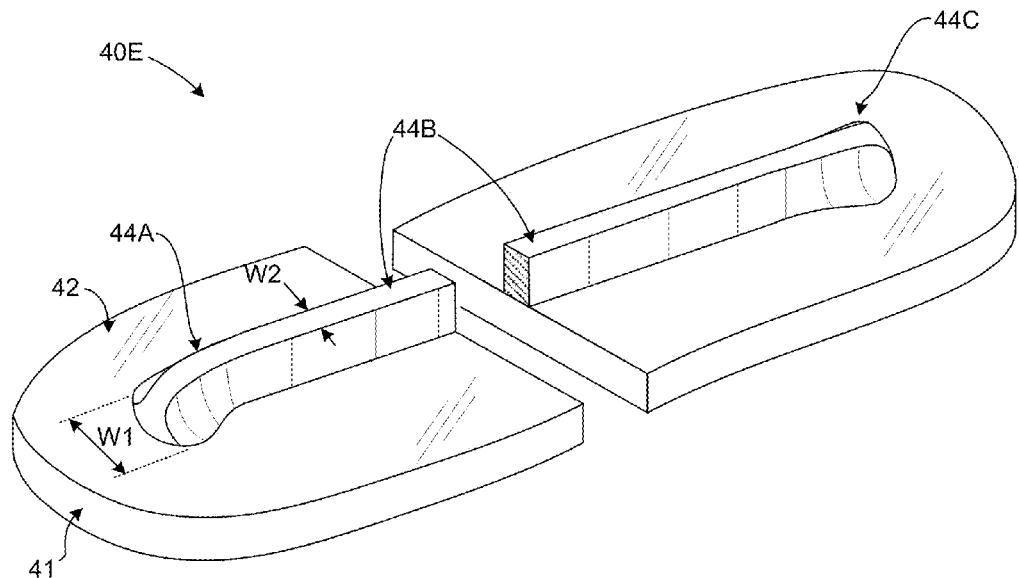

Referring to the lower portion (block 340) of FIG. 11 and to FIGS. 16(A) and 16(B), an optional final phase involves removing sacrificial portions 57B1 and 57B2 (shown in FIG. 16(A)) from the opposing sides of central gridline structure 44B. This removal may involve firing, using an etchant, or using another mechanism known to those skilled in the art. A completed gridline 44E disposed on surface 42 of substrate 41 is shown in FIG. 16(B).

The present inventors have utilized the methods described above to produce H-pattern solar cells 40E including gridlines having a nominal width of 50 microns and endpoint structures having a nominal width of in the range of 300 to 400 microns, although practical considerations have set a currently preferred endpoint/gridline width ratio in the range of approximately 2 to 5.

Figure 17:
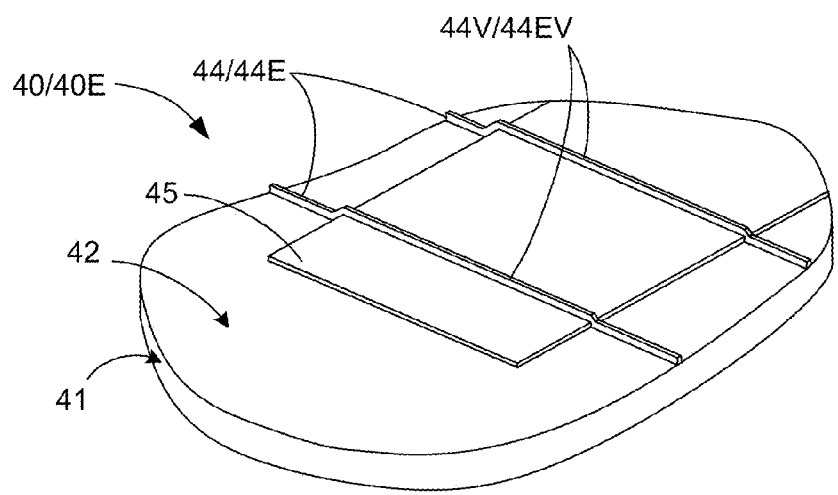
FIG. 17 a partial perspective view showing a gridline-to-busbar structure of an H-pattern solar cell produced in accordance with another embodiment of the present invention.

Referring to FIG. 17, according to another aspect of the present invention, H-pattern solar cells 40 and 40E (both described above) are produced with gridlines 44 and 44E printed across busbars 45 such that non-coplanar gridline vertex portions 44V and 44EV are produced that extend above the upper surface of busbars 45. In particular, vertex portions 44V/44EV are generated where the uppermost portion of each gridline 44/44E is substantially higher than the uppermost portion of underlying busbars 45.

Figure 18:
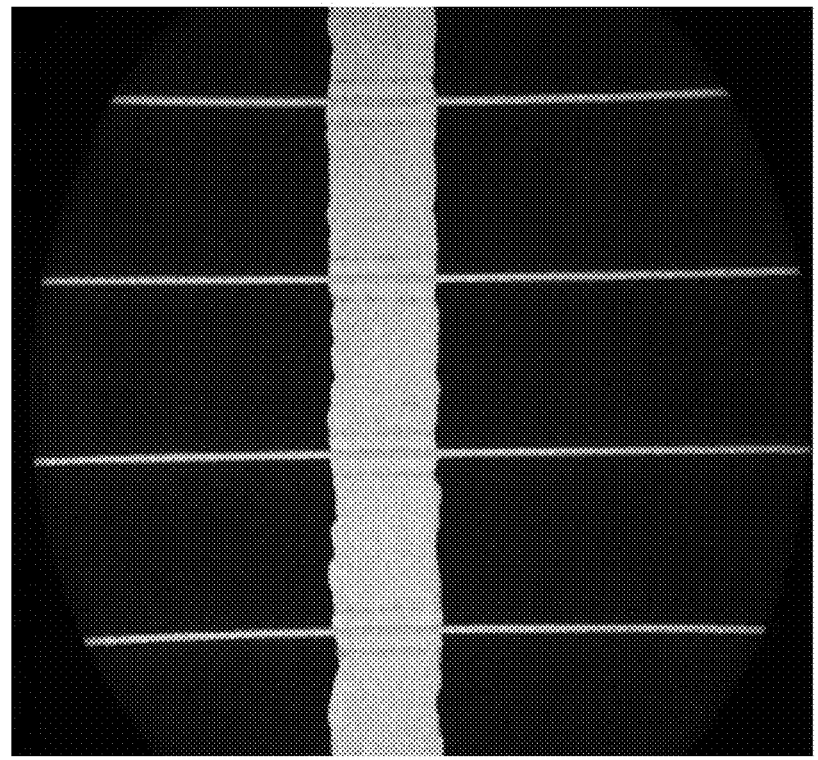
FIG. 18 is a micrograph showing exemplary gridline-to-busbar structures.

According to a specific embodiment, busbars 45 are printed on upper surface 42 of substrate 41, and then gridlines 44/44E are printed on surface 42 in a direction orthogonal to busbars 45 while the printed busbar material is still wet. FIG. 18 is an optical micrograph of gridline bus bar vertices after the solar cell print is dried and fired at high temperature. Note that there is some displacement of the bus bar metal by the coextruded ink as it is placed over top the wet bus bar ink.

The method of printing gridlines 44/44E on still-wet busbar structures 45 in the manner described above provides several benefits. First, not having to planarize the vertex formed by gridlines 44/44E on busbar 45 allows for the use of higher viscosity inks during formation of both gridlines 44/44E and busbars 45, which facilitates the production of high aspect ratio gridlines, which in turn provides a substantial efficiency improvement on the order of 0.6% absolute. Second, in the case of co-extruded gridlines 44E (described above), the disclosed method greatly improves yields over a reversed printing order in that the inventors have observed that busbars printed onto gridlines 44E break where the busbar crosses over the sacrificial portions on either side of the gridline, which makes cell testing and sorting inaccurate because of an anomalously large series resistance.

Although the present invention has been described with respect to certain specific embodiments, it will be clear to those skilled in the art that the inventive features of the present invention are applicable to other embodiments as well, all of which are intended to fall within the scope of the present invention. For example, although the embodiments described above include endpoint structures formed at both ends of each gridline structure (i.e., two endpoint structures per gridline), reliable and functional cells may be produced that include one endpoint structure disposed at one end of each gridline. Therefore, unless otherwise specified in the appended claims, the structures, systems and methods associated with the present invention are not intended to be limited to the two-endpoint-structure-per-gridline arrangements described above with reference to the specific embodiments.

The invention claimed is:

1. An H-pattern solar cell structure, comprising:
a semiconductor substrate;
at least one busbar disposed in a first direction on an upper surface of the substrate; and
a plurality of parallel gridlines formed on the upper surface such that each of the plurality of gridlines extends in a second direction that is substantially orthogonal to the first direction such that all of the plurality of parallel gridlines contact the at least one busbar,
wherein each of the plurality of gridlines comprises a central gridline portion and at least one endpoint structure disposed on at least one of the two opposite ends of the central gridline portion, wherein said at least one endpoint structure has a nominal width that is at least 1.5 times as wide as a second nominal width of said central gridline portion, and
wherein the at least one endpoint structure does not terminate at the at least one busbar.

2. The H-pattern solar cell according to claim 1, wherein each of the plurality of gridlines comprises a first endpoint structure disposed on a first end of the central gridline portion, and a second endpoint structure disposed on a second end of the central gridline portion.

3. The H-pattern solar cell according to claim 1, wherein a ratio of the first nominal width to the second nominal width is in the range of 2 to 10.

4. The H-pattern solar cell according to claim 3, wherein the second nominal is approximately 50 microns, and the first nominal width is in the range of 300 to 400 microns.

5. The H-pattern solar cell according to claim 1, wherein a ratio of the first nominal width to the second nominal width is in the range of 2 to 5.

6. The H-pattern solar cell according to claim 1, wherein said at least one endpoint structure includes a base portion disposed on the upper surface of the substrate and having said first width, and a tapered central ridge portion extending upward from said base portion such that an upper edge of said tapered central ridge portion has a width that is narrower than said first width.

7. The H-pattern solar cell according to claim 1, wherein each central gridline portion of the plurality of said gridlines includes a vertex portion extending from an upper surface of the at least one busbar.

* * * * *